United States Patent
Ode et al.

(10) Patent No.: US 7,197,286 B2
(45) Date of Patent: Mar. 27, 2007

(54) RADIO WITH A DISTORTION COMPENSATION CAPABILITY

(75) Inventors: Takayoshi Ode, Kawasaki (JP); Toru Maniwa, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 423 days.

(21) Appl. No.: 10/371,590

(22) Filed: Feb. 20, 2003

(65) Prior Publication Data

US 2004/0198263 A1  Oct. 7, 2004

(30) Foreign Application Priority Data

May 17, 2002  (JP) .............................. 2002-142509

(51) Int. Cl.
*H04B 1/04* (2006.01)

(52) U.S. Cl. .............................. 455/114.3; 455/127.1; 375/297

(58) Field of Classification Search .. 455/114.1–114.3, 455/126, 127.1–127.2; 375/296–297; 330/149
See application file for complete search history.

(56) References Cited

U.S. PATENT DOCUMENTS

| 4,107,621 A | * | 8/1978 | Furutani et al. ............ 330/296 |
| 5,903,823 A | * | 5/1999 | Moriyama et al. .......... 455/126 |
| 6,275,103 B1 | * | 8/2001 | Maniwa ....................... 330/149 |
| 6,737,918 B2 | * | 5/2004 | Oishi et al. .................. 330/149 |

FOREIGN PATENT DOCUMENTS

| JP | 2000-252914 | | 9/2000 |
| JP | 2001094617 A | * | 4/2001 |
| JP | 2001-251148 | | 9/2001 |

* cited by examiner

*Primary Examiner*—Nguyen T. Vo
(74) *Attorney, Agent, or Firm*—Katten Muchin Rosenman LLP

(57) ABSTRACT

A radio comprises a power amplifier for amplifying a signal to be transmitted; a distortion compensation table storing distortion compensation coefficients for compensating a distortion of the power amplifier; a computing unit for updating the distortion compensation coefficient based on a difference between a transmission input signal and a transmission output signal; a bias voltage controller for applying a bias voltage to the power amplifier, said bias voltage determined based on a transmit control signal so as to maximize a power efficiency of the power amplifier.

14 Claims, 25 Drawing Sheets

PRIOR ART

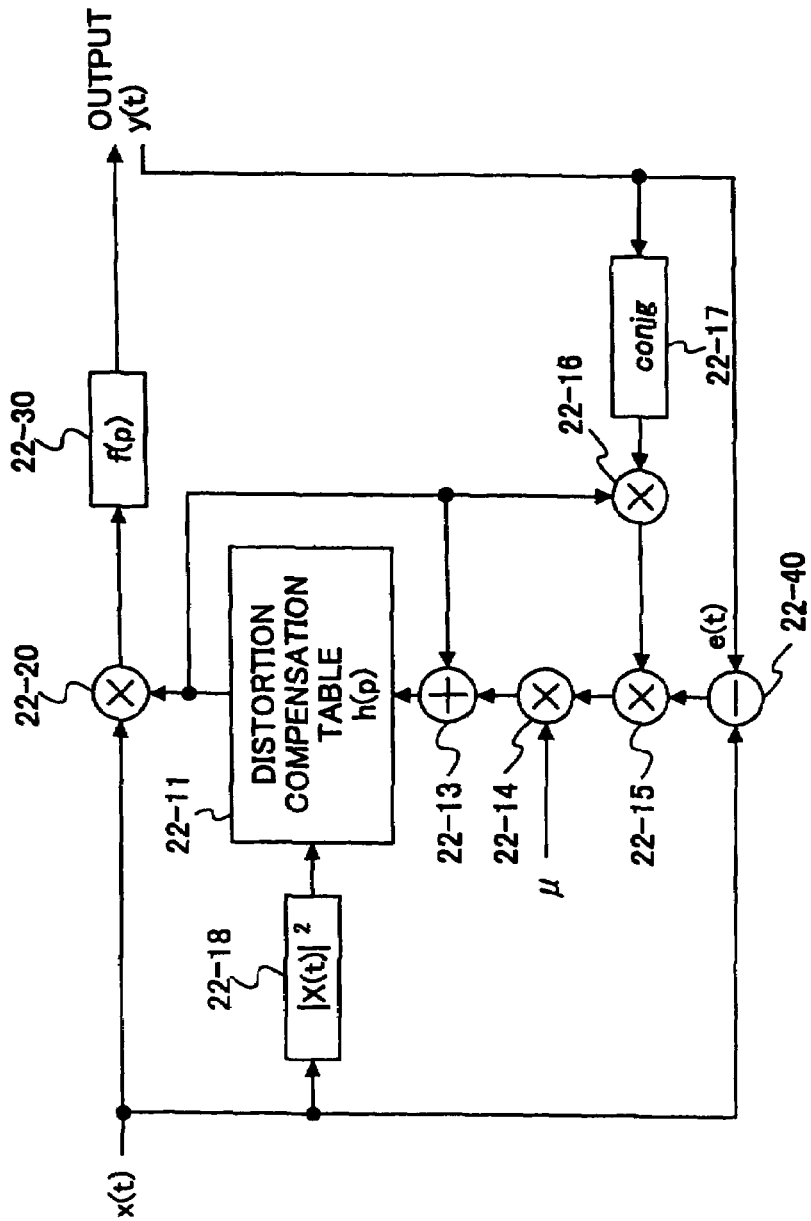

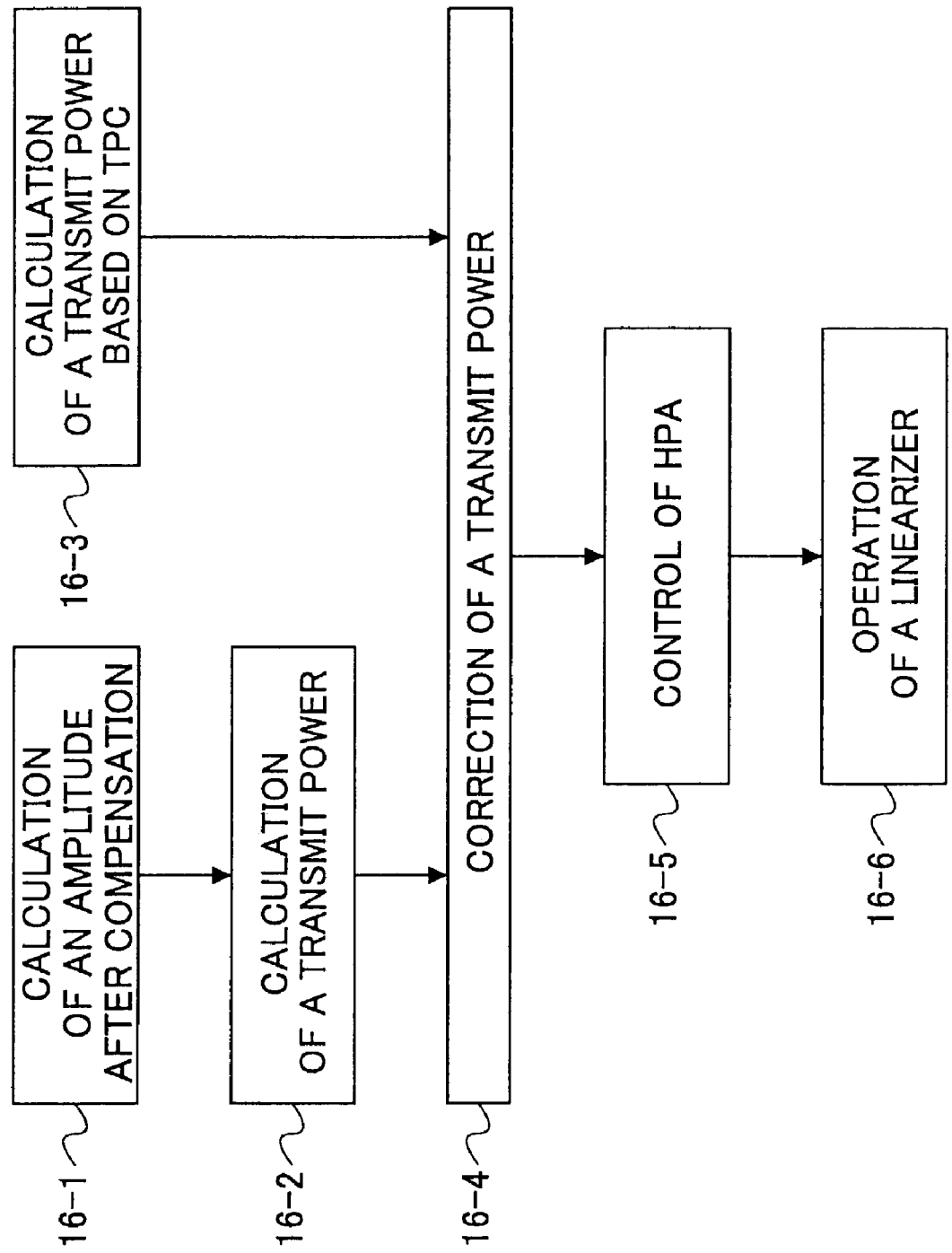

RADIO WITH A DISTORTION COMPENSATION CAPABILITY

BACKGROUND OF THE INVENTION

1. Field of the Invention

The present invention relates to a radio for a W-CDMA (Wideband Code Division Multiple Access) mobile communication system and the like, which has a distortion compensation capability to reduce Adjacent Channel Leakage power by compensating a distortion of a transmission signal and to achieve high power-added efficiency of a power amplifier.

2. Description of the Related Art

I. Distortion and Efficiency of the High Power Amplifier.

In wireless communication systems, especially in mobile communication systems such as W-CDMA and PDC, the transmit power is high and ranges from 10 mW to several tens of Watts. Since the transmit power has to be controlled according to the distance between one communication device and the other, the dynamic range of the transmit power becomes significantly wide. Thus, it is necessary to make use of a high power amplifier (HPA) that can avoid distorting a signal even at maximum transmit power.

FIG. 1 illustrates plots of output power and power-added efficiency versus input power of the high power amplifier (HPA). As illustrated, while the power-added efficiency of the HPA is high in a non-linear area of the transmit power (output power of the HPA), it is low in a linear area in which the transmit power (output power of the HPA) is low and the requirement as to an Adjacent Channel Leakage power Ratio (ACLR) is met.

The term "power-added efficiency" used herein expresses the power ratio, which is derived by dividing the power added by the HPA (the power difference between the output power and the input power) by the product of the power voltage and the supply current applied to the HPA (the power consumption of the HPA).

The leakage power into an adjacent channel is strictly regulated, because it constitutes noise in other channels and causes degradation of the communication quality of the other channels and produces a detrimental effect on the capacity of the communication, as shown in FIG. 2A. Here, the Adjacent Channel Leakage power Ratio (ACLR) is an index for regulating the leakage power, which has also been referred to as Adjacent Channel Power Ratio (ACPR).

As for a detailed explanation, the first Adjacent Channel Leakage power Ratio (ACLR1) is the ratio between the output power P1 of the channel indicated by the diagonally hatched area shown in FIG. 2B and the output power (PL1 or PH1) of one of the first adjacent channels indicated by the vertically hatched area shown in FIG. 2B, as follows.

$$ACLR1=(PL1 \text{ or } PH1)/P1 \quad (1)$$

Likewise, the second Adjacent Channel Leakage power Ratio (ACLR2) is the ratio between the output power P1 of the channel (diagonally crosshatched) and the output power (PL2 or PH2) of one of the second adjacent channels indicated by the horizontally hatched area shown in FIG. 2B, as follows.

$$ACLR2=(PL2 \text{ or } PH2)/P1 \quad (2)$$

FIG. 3A shows the non-linear area and the linear area of the HPA. While the leakage power into an adjacent channel is low in the linear area in which the output power of the HPA is proportional to the input power, it is high in the non-linear area in which the output power of the HPA is not proportional to the input power.

Therefore, it may be possible to use the HPA whose linear area is wide (i.e., the HPA whose maximum output power that cannot cause a distortion is high) for the purpose of the high output power and the suppression of leakage power. However, the HPA has to be equipped with capability greater than is required in its practical use, which can lead to an increase in cost and size.

On the other hand, with the traditional HPA, the power-added efficiency is significantly lower in the linear area. Thus, when the transmission is accomplished at a certain predetermined output power, the wasted consumption power of the traditional HPA ranges from several times to several tenths of the output power. In other words, it has a disadvantage in terms of increased consumption power.

II. Control of a Bias Voltage of the HPA.

Under the circumstances, the techniques for controlling the bias voltage of the HPA so as to reduce the consumption power have been proposed (for example, Japanese laid-open patent publication 2001-019792).

FIG. 3B shows the graph, in which the power-added efficiency is plotted versus the transmit power (the output power of the amplifier) which meets the specification as to the Adjacent Channel Leakage power Ratio (ACLR). In this figure, the plots of the power-added efficiency at bias voltage A1[V] are indicated by the symbol O, and the plots at bias voltage A2[V] are indicated by the symbol Δ and, the plots at bias voltage A3[V] are indicated by the symbol X, where A3<A2<A1. As illustrated, the power-added efficiency increases as the bias voltage decreases.

As for a detailed explanation, as shown in FIG. 4A, it is given that the power-added efficiency is η3 when the bias voltage A1[V] is applied to the HPA with the transmit power Pa. Then, the power-added efficiency at the bias voltage A2[V] (A2<A1) is η2 (η2>η3) and the power-added efficiency at the bias voltage A3[V] (A3<A2) is η1 (η1>η2) with the transmit power Pa.

FIG. 4B shows the effects of controlling the bias voltage, in which a dashed line indicates the graph without bias voltage control and a solid line indicates the graph with bias voltage control. In this way, by appropriately controlling the bias voltage of the HPA so that the Adjacent Channel Leakage power Ratio (ACLR) is met and the power-added efficiency is improved, it becomes possible to improve the power-added efficiency versus the transmit power (the output power of HPA). However, in the case of high output power, the power-added efficiency without bias voltage control is better than the power-added efficiency with bias voltage control.

FIG. 5 shows a block diagram for controlling the bias voltage of HPA 21-4 according to prior art. In this embodiment according to prior art, first of all, transmit power is determined at a bias voltage controller 21-1 based on a Transmit Power Control (TPC) signal. Then, the bias voltage (power supply voltage) is determined appropriately such that the power-added efficiency becomes the maximum.

Then, based on the result of this determination, the bias voltage controller 21-1 sets the output power of DC—DC converters 21-2, 21-3. Although the input bias and the output bias of the HPA 21-4 are controllable by bias tees 21-5 21-6, respectively, in this arrangement shown in FIG. 5, an arrangement in which only one of the input bias and the output bias is controllable may be applicable, as far as the power-added efficiency is improved.

III. Distortion Compensation.

As has been discussed, to reduce the consumption power and keep the power-added efficiency high, the use of the non-linear area of the HPA is indispensable. However, the use of the non-linear area causes an increase of the distortion level, which can lead to the degradation of the Adjacent Channel Leakage power Ratio (ACLR) shown in FIG. 2.

Under these contradictory conditions, a distortion compensator (linearizer) is proposed as a means of keeping the transmit power and the power-added efficiency high while suppressing the distortion. The linearizer compensates the distortion of the waveform of the transmission signal at the high transmit power so as to keep the power-added efficiency high. The detailed information about the linearizer is disclosed in JP 09-69733A and JP 2000-251148A, etc.

FIG. 6A shows the fundamental block diagram of the linearizer. The linearizer is provided with an adaptive distortion compensation controller 22-10 that generates a distortion compensation coefficient according to the amplitude of the baseband signal x (t) using an adaptive algorithm.

The amplitude distortion and the phase distortion f (p) of the HPA 22-30 with respect to a certain power level of the baseband signal x (t) is expressed as a complex number. The amplitude distortion and the phase distortion f (p) of the HPA 22-30 are compensated at a multiplier 22-20 as a result of multiplying the baseband signal x (t) by the distortion compensation coefficient of a complex number determined according to the amplitude so as to pre-distort the baseband signal x (t).

The adaptive distortion compensation controller 22-10 comprises a distortion compensation table 22-11 for storing and retaining the distortion compensation coefficients and a distortion compensation coefficient generator 22-12. The distortion compensation table 22-11 stores and reads out the distortion compensation coefficient according to the amplitude.

The distortion compensation coefficient generator 22-12 estimates the distortion compensation coefficient based on a difference signal e (t) output from a subtracter 22-40 that calculates the difference between the baseband signal x (t) and the output signal from the HPA 22-30. The estimated distortion compensation coefficient is stored and retained in the distortion compensation table 22-11. An adaptive algorithm is made use of for this estimation. There are various types of adaptive algorithms commonly known. For detailed information about these algorithms, reference should be made to a book such as "An Introduction to Adaptive Filters" by S. Haykin.

FIG. 6B shows the diagram of a circuit for estimating and generating the distortion compensation coefficients. As shown in FIG. 6B, it comprises a distortion compensation table 22-11 for storing and retaining the distortion compensation coefficients, an adder 22-13 for computing the distortion compensation coefficients based on the difference signal e (t), multipliers 22-14, 22-15, 22-16, and a complex conjugate transform circuit 22-17.

The distortion compensation coefficient h (p) is calculated as follows.

$$h_n(p) = h_{n-1}(p) + \mu e(t) u^*(t) \quad (3)$$

$$e(t) = x(t) - y(t) \quad (4)$$

$$u(t) = x(t) f(p) \approx h^*_{n-1}(p) y(t) \quad (5)$$

$$h_{n-1}(p) h^*_{n-1}(p) \approx 1 \quad (6)$$

$$y(t) = h^*_{n-1}(p) x(t) f(p) \quad (7)$$

$$p = |x(t)|^2 \quad (8)$$

Where $h_n$ (p) is the distortion compensation coefficient updated n times, $h_{n-1}$ (p) is the distortion compensation coefficient updated n-1 times (the last time), μ is the step-size parameter as to the update amount, y (t) is the output signal of the HPA, and f (p) is a distortion function for the HPA. Further, x (t), y (t), f (p), $h_n$ (p), $h_{n-1}$ (p), u (t), and e (t) are complex numbers, and the symbol "*" indicates a conjugate complex number. Further, u (t) is a value approximated according to the equation (5) on the assumption that the amplitude distortion of the HPA is not so large (i.e., $h_{n-1}$(p) $h^*_{n-1}$(p)≈1).

$h_n$ (p) of the equation (3) is the distortion compensation coefficient to be updated this time and input to the distortion compensation table 22-11. y* (t) is output from the complex conjugate transform circuit 22-17 that generates the conjugate complex number according to the output signal y (t) of the HPA. Accordingly, the output of the multiplier 22-16 is y* (t) $h_{n-1}$ (p).

Then, the output of the multiplier 22-16 is multiplied by the output e (t) of the subtracter 22-40. Accordingly, y* (t) $h_{n-1}$ (p) e (t) is output. Then, after being multiplied by the step-size parameter μ at the multiplier 22-14, it is added to $h_{n-1}$ (p) at the adder 22-13.

Accordingly, the estimated distortion compensation coefficient $h_n$ (p) to be updated is as follows.

$$h_n(p) = \mu y^*(t) h_{n-1}(p) e(t) + h_{n-1}(p) \quad (8)$$

Here, given that u (t)≈$h^*_{n-1}$ (p) y (t) as in the equation (5), u* (t) is as follows.

$$u^*(t) = y^*(t) h_{n-1}(p) \quad (10)$$

Consequently, the distortion compensation coefficient $h_n$ (p) is expressed as the equation (3).

The equation (8) is the one for calculating the level of the power of the baseband signal and it is calculated at an electric power calculator 22-18. If the equation (8) is the one for calculating the amplitude of the baseband signal x (t), the equation (8) will be expressed as p=|x (t)|. Alternatively, if p is the function of the electric power or the amplitude, p may be calculated as p=g(|x(t)|²) or p=g(|x(t)|).

The value of p calculated at the electric power calculator 22-18 indicates the address for the distortion compensation table 22-11 at the time of writing and reading. If the update operation by this writing and the operation of multiplying the baseband signal by the distortion compensation coefficient are carried out independently, it is always possible to apply the pre-distortion without being subject to the influence of the delay of the system as a whole. Although the example of the adaptive algorithm using a least mean squares method (LMS) is disclosed herein, the use of a clipped LMS algorithm or an exponential weighting RSL algorithm is applicable (for example, see JP 09-69733A).

By the way, in the case of controlling the bias voltage of the HPA according to the prior art as shown in FIG. 5, the specification as to the Adjacent Channel Leakage power Ratio (ACLR) should be met. For this reason, it becomes impossible to accomplish the best power-added efficiency, if the bias voltage of the HPA is set to a fixed value of the power supply voltage. In other words, one can only hope for the improvement as shown in FIG. 4B.

On the other hand, according to the arrangement using the linearizer as shown in FIG. 6, the suppression of the distortion by multiplying the input signal by the distortion compensation coefficient permits use of the non-linear area of the HPA. Accordingly, the improvement of the power-added efficiency can be attained when the transmit power is relatively high. However, the power-added efficiency becomes low when the transmit power is low, as shown in FIG. 1.

SUMMARY OF THE INVENTION

Accordingly, it is a general object of the present invention to provide a radio equipped with a distortion compensation capability to improve the power-added efficiency so that the transmission is accomplished with the best power-added efficiency at any transmit power while meeting the specification as to the Adjacent Channel Leakage power Ratio (ACLR).

To achieve the object, according to one aspect of the present invention, a radio comprising;

a power amplifier for amplifying a signal to be transmitted;

a distortion compensator for compensating a distortion of the power amplifier, said distortion compensator having a distortion compensation coefficient update part for updating distortion compensation coefficients based on a difference between a transmission input signal input to the power amplifier and a feedback signal of a transmission output signal output from the power amplifier, a memory part for storing said distortion compensation coefficients, and a distortion compensation coefficient multiplier for reading out the distortion compensation coefficient from said memory part according to a level of a transmission input signal and multiplying said transmission input signal by said distortion compensation coefficient; and a bias voltage controller for determining a bias voltage of the power amplifier based on the level of the transmission input signal or a transmit power control signal so as to improve power efficiency of the power amplifier.

Preferably, the bias voltage controller reads out the bias voltage that substantially maximizes power efficiency of the power amplifier from a memory device.

Preferably, the distortion compensator reads out the distortion compensation coefficient from the memory device according to a level of the transmission input signal and a level of the bias voltage of the power amplifier, said memory device storing distortion compensation coefficients, each of the distortion compensation coefficients being associated with a level of the transmission input signal and a level of the bias voltage.

Preferably, the bias voltage controller smoothes a change of the bias voltage of the power amplifier.

Preferably, the distortion compensated transmission input signal output from the distortion compensator is input to the power amplifier via a delay element so that the input of the distortion compensated transmission input signal is timed to the setting of the bias voltage.

According to the present invention, it becomes possible to transmit an undistorted signal efficiently, whereby reducing power consumption and heat radiation. Consequently, miniaturization and weight reduction of the overall radio including the power amplifier becomes possible.

BRIEF DESCRIPTION OF THE DRAWINGS

Other objects, advantages, and further features of the present invention will become more apparent as the description proceeds taken in conjunction with the accompanying drawings in which:

FIG. 6B shows a circuit for estimating and generating distortion compensation coefficients.

FIG. 22 shows the operation flow according to the twelfth embodiment.

DETAILED DESCRIPTION OF THE PREFERRED EMBODIMENT

The present invention makes use of a bias voltage control technique for a high power amplifier (HPA) in combination with a technique for distortion compensation (linearizer). The present invention makes it possible to advantageously utilize the non-linear area of the HPA by controlling the bias voltage (power supply voltage) of the HPA.

Figure 7:
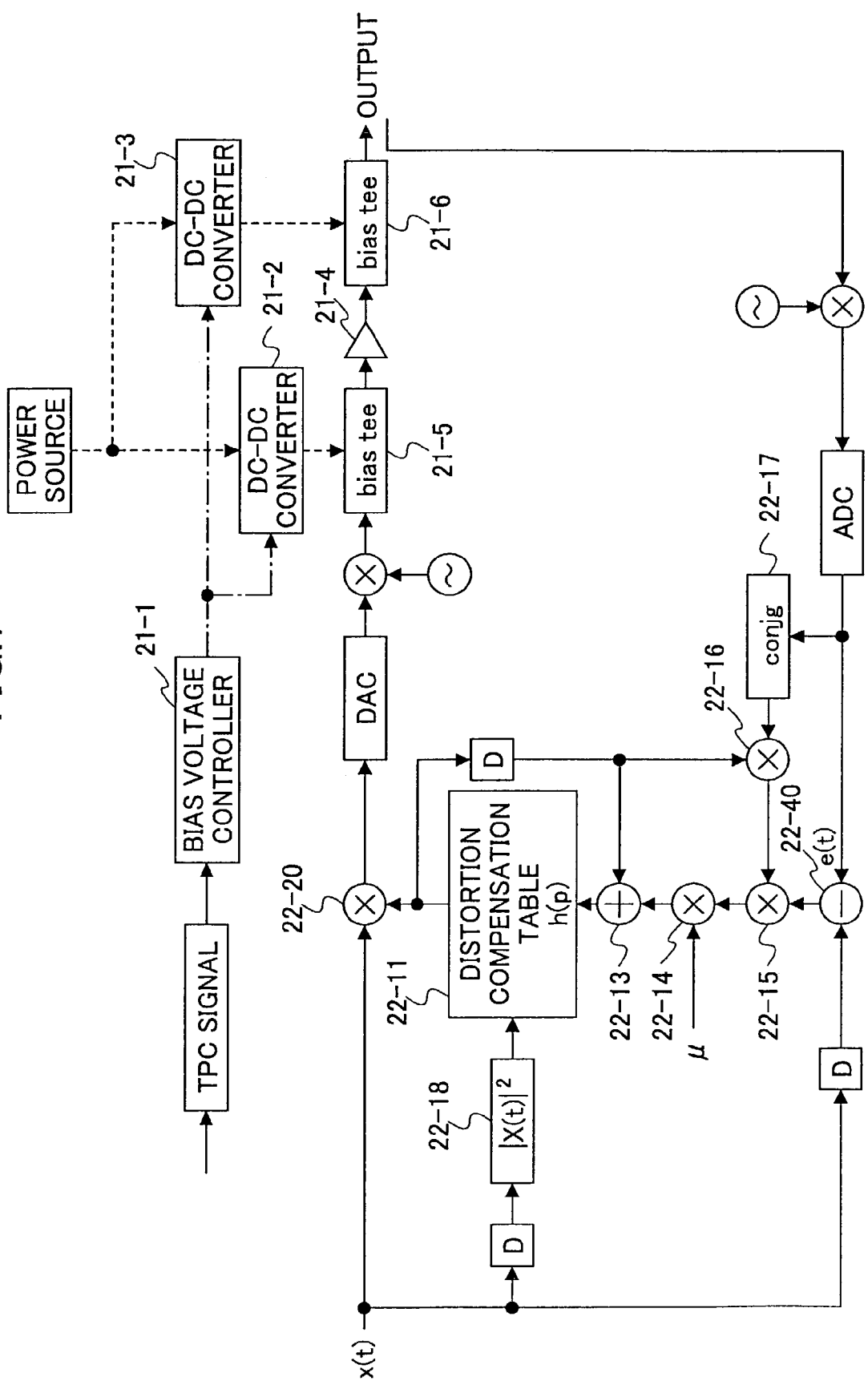
FIG. 7 shows the first embodiment of the present invention.

FIG. 7 shows the first embodiment of the present invention. In this embodiment, transmit power (output power) is calculated at a bias voltage controller 21-1 based on a transmit power control (TPC) signal received from a base station. The most effective bias voltage is determined based on the calculated output power. In this embodiment, although the descriptions are directed to control of the bias voltage, it is also possible to control the power supply voltage supplied for the operation of the HPA.

Figure 4A:
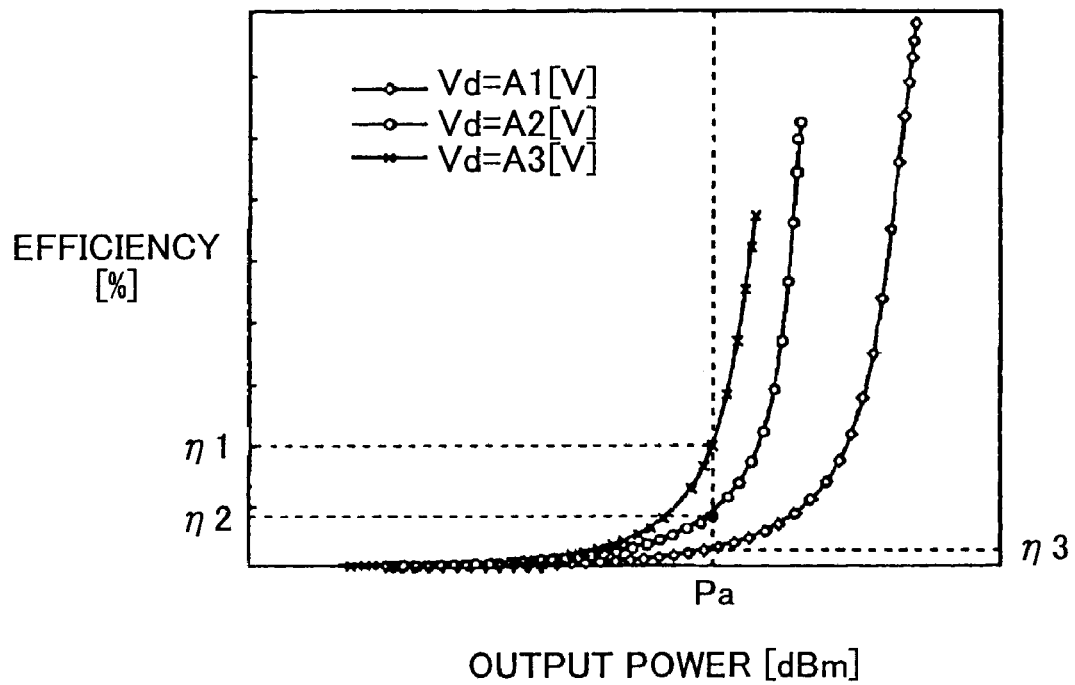
FIG. 4A shows a model of an improved power-added efficiency of a high power amplifier (HPA).
Figure 4B:
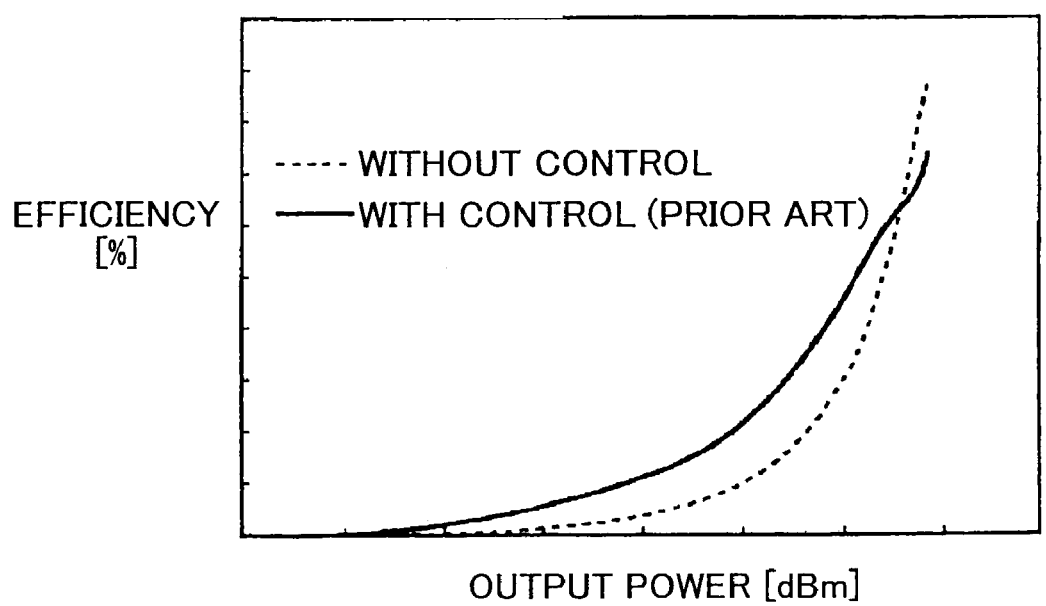
FIG. 4B shows the effects of controlling the bias voltage.
Figure 5:
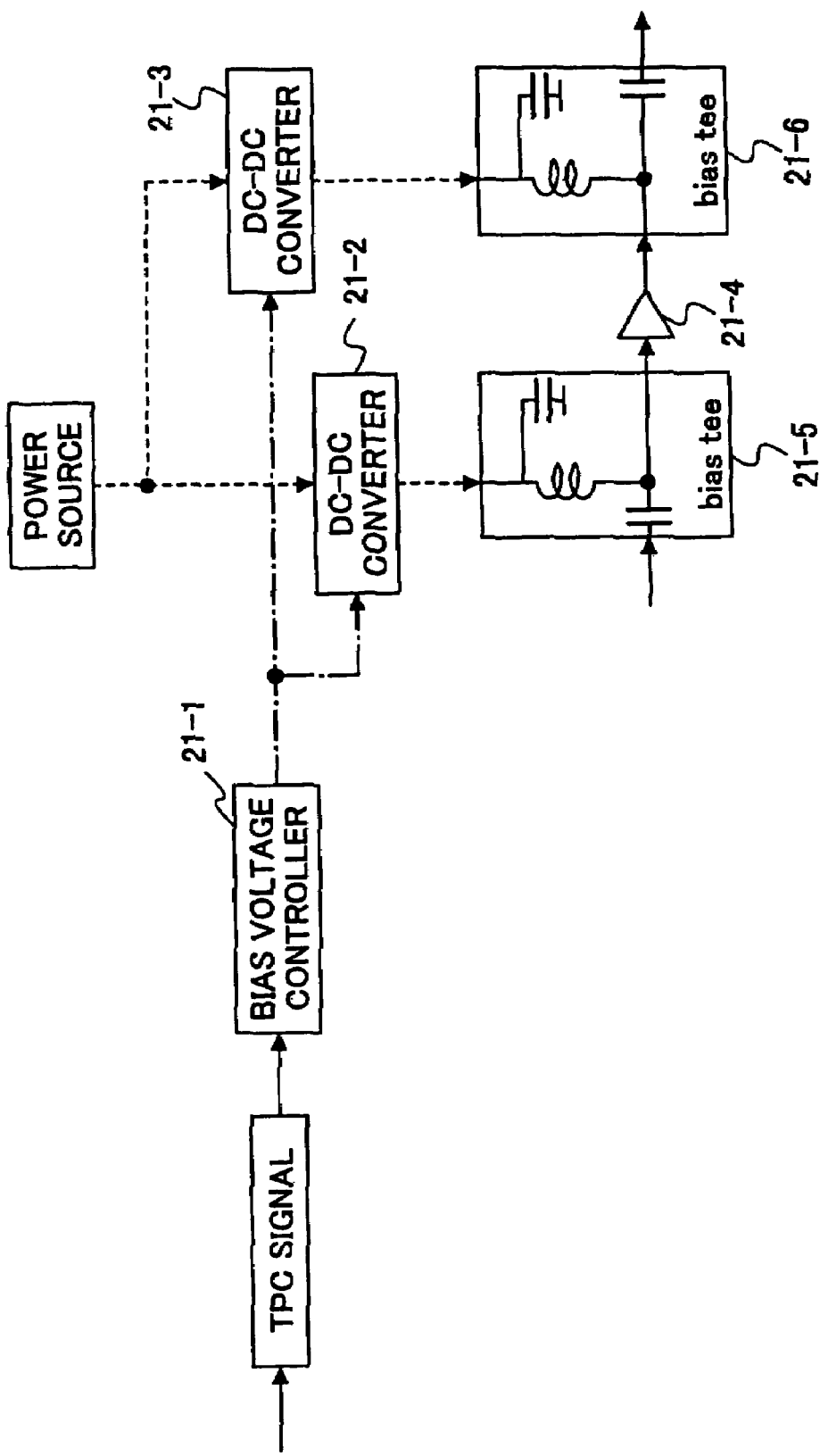
FIG. 5 shows the block diagram for controlling the bias voltage of a HPA according to prior art.
Figure 6A:
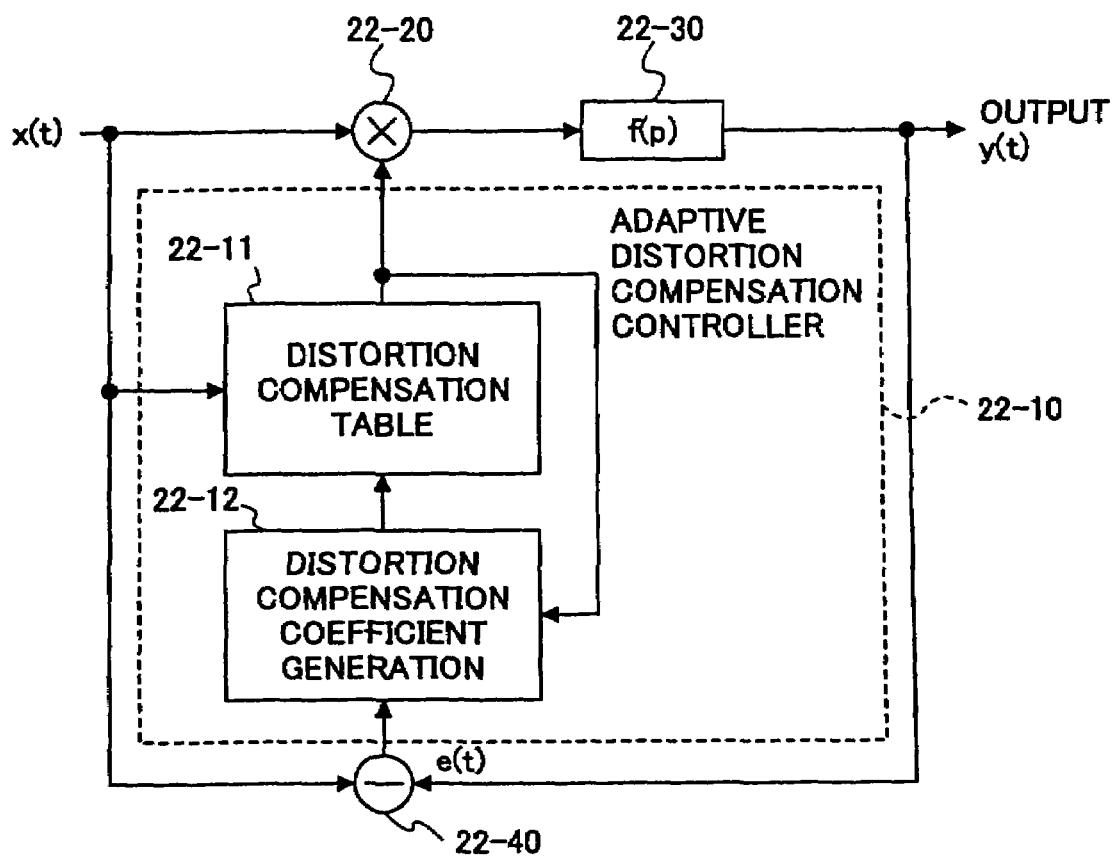
FIG. 6A shows a fundamental block diagram of a linearizer.

Referring to FIG. 4A for the description of this embodiment, the bias voltage, which maximizes the power-added efficiency versus the transmit power, is selected, as shown in FIG. 4A. However, since the selection of the bias voltage where the power-added efficiency becomes the maximum means the use of the non-linear area of the HPA, the level of distortion of the HPA is large. In other words, it causes the degradation of the Adjacent Channel Leakage power Ratio (ACLR). However, the Adjacent Channel Leakage power Ratio is to be improved by the distortion compensation as described later.

The bias voltage controller 21-1 controls the bias voltage of the HPA 21-4 though control of DC—DC converters 21-2, 21-3. In other words, the control of the DC—DC converters 21-2, 21-3 allows the bias voltage of the HPA 21-4 to be varied.

Figure 2A:
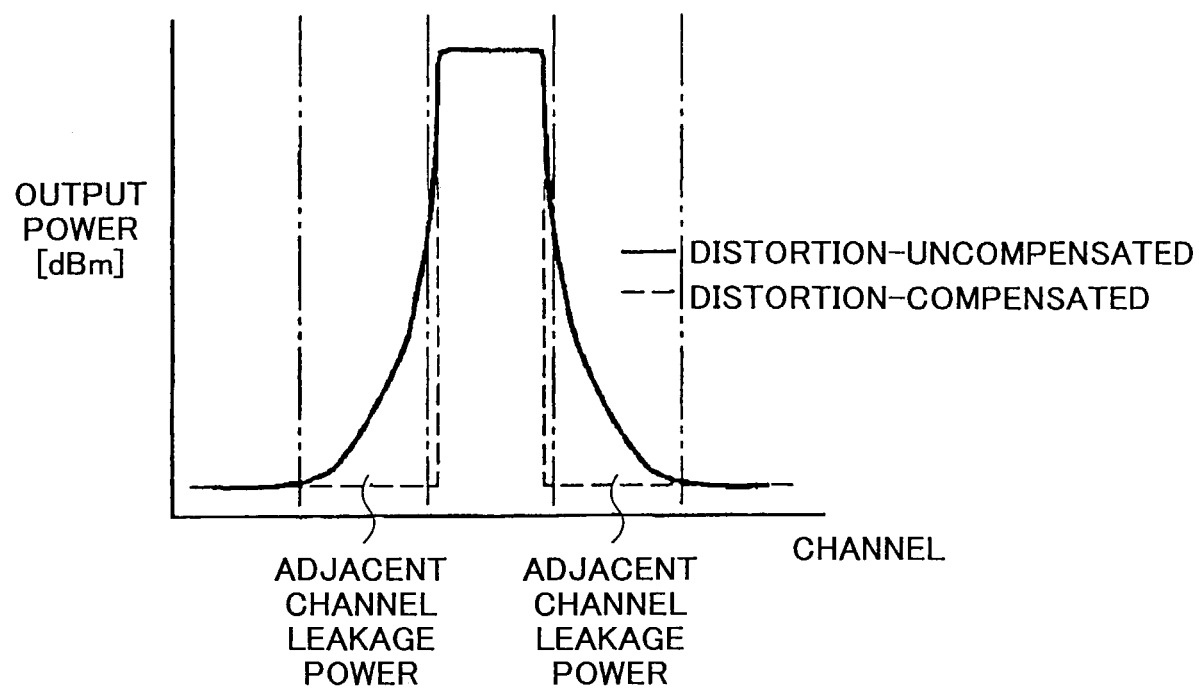
FIG. 2A shows adjacent channel leakage power.
Figure 2B:
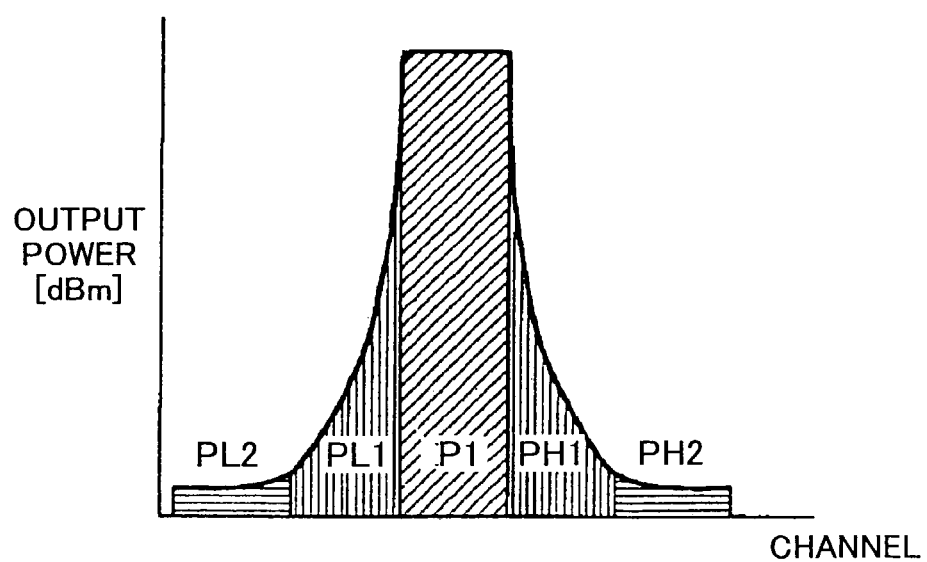
FIG. 2B shows adjacent channel leakage power.
Figure 3A:
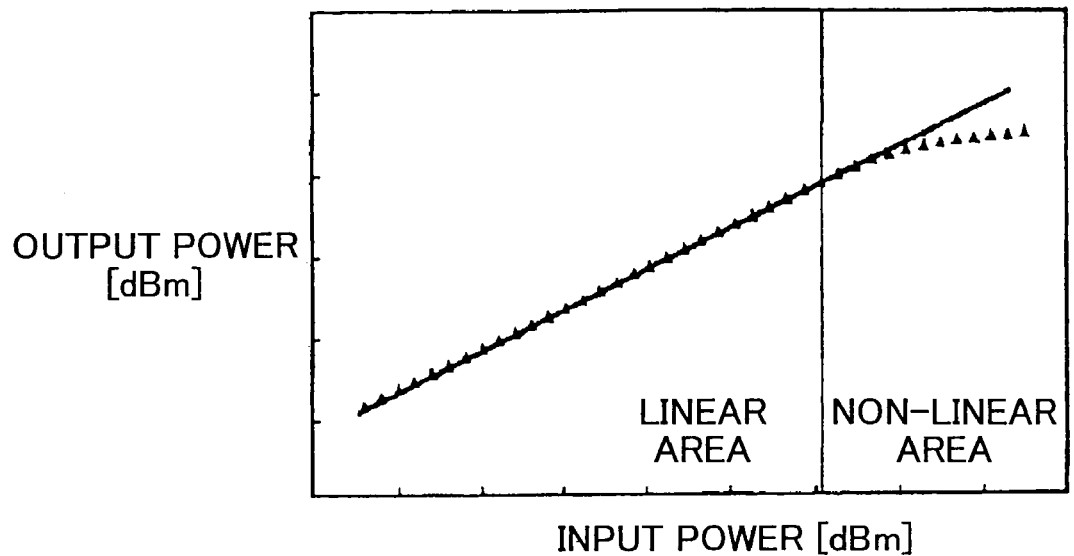
FIG. 3A shows a linear area and a non-linear area of a high power amplifier (HPA).
Figure 3B:
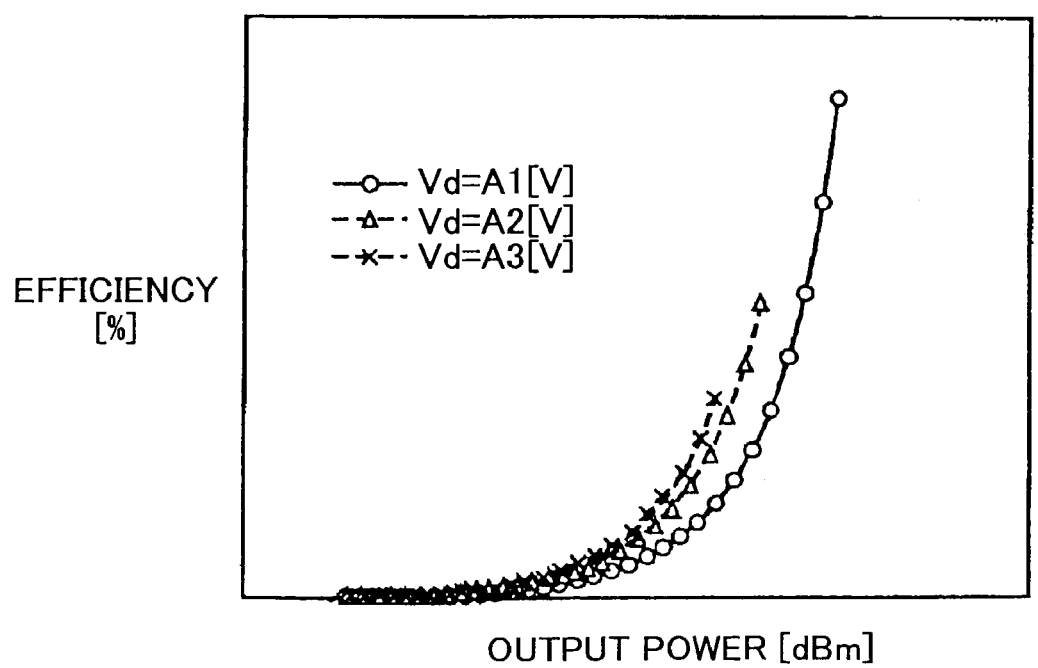
FIG. 3B shows power-added efficiency versus transmit power.

Then, the operation of a distortion compensator (linearizer) compensates the distortion of the HPA 21-4 to improve the Adjacent Channel Leakage power Ratio (ACLR). In other words, the Adjacent Channel Leakage power Ratio (ACLR) is improved from the spectrum without the distortion compensation indicated by a solid line in FIG. 2A to the spectrum with the distortion compensation indicated by a dashed line in FIG. 2A.

Figure 8:
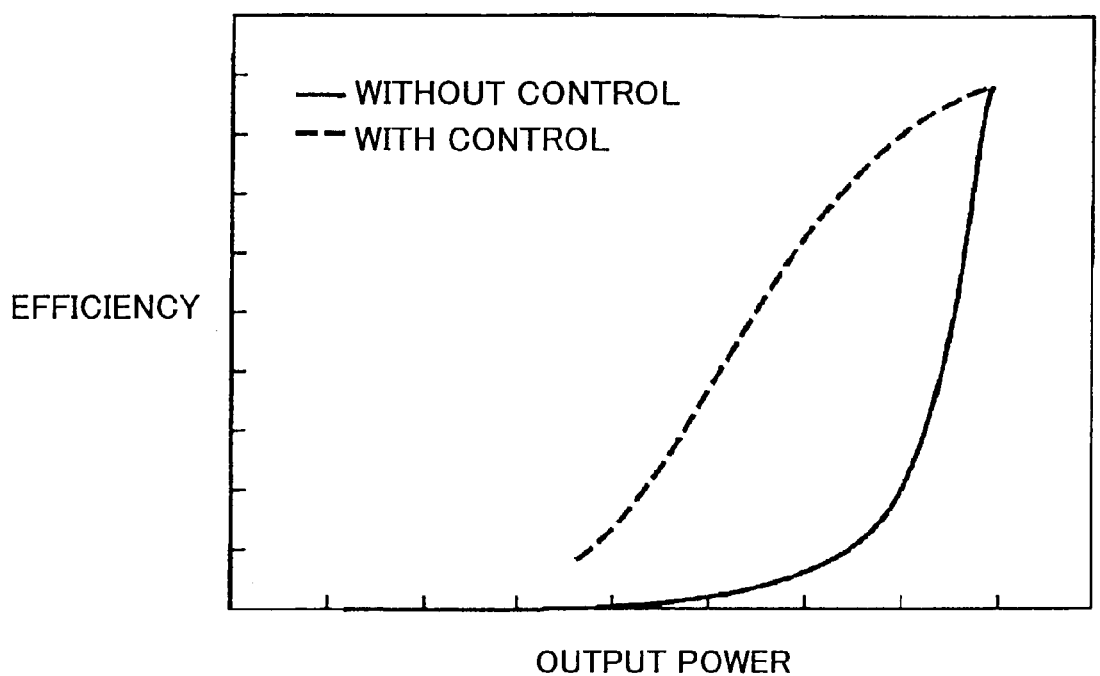
FIG. 8 shows the relationship between transmit power and power-added efficiency according to the present invention.

FIG. 8 is a graph showing the relationship between the output power and the power-added efficiency according to this embodiment of the present invention. In this graph, the solid line indicates the efficiency in the case of not controlling the bias voltage and the dashed line indicates the efficiency in the case of controlling the bias voltage. In this manner, the combination of the bias voltage control and the distortion compensation enables extensive improvement of the efficiency of the HPA, as shown in FIG. 8 by the dashed line.

The improvement of the efficiency leads to a reduction of the power requirements and thereby a reduction of heat generation, which allows miniaturization or the elimination of a heat sink. Consequently, it enables miniaturization and weight reduction of the overall apparatus such as the transmitter including the HPA.

Although both the input bias and the output bias of the HPA are controlled in this arrangement shown in FIG. 7, the arrangement in which only one of the input bias and the output bias is controlled is also applicable, as far as the power-added efficiency is improved. Furthermore, transmission signal x (t) may be a baseband signal, a modulated signal of a carrier wave, or modulated signals of several carrier waves.

Figure 9:
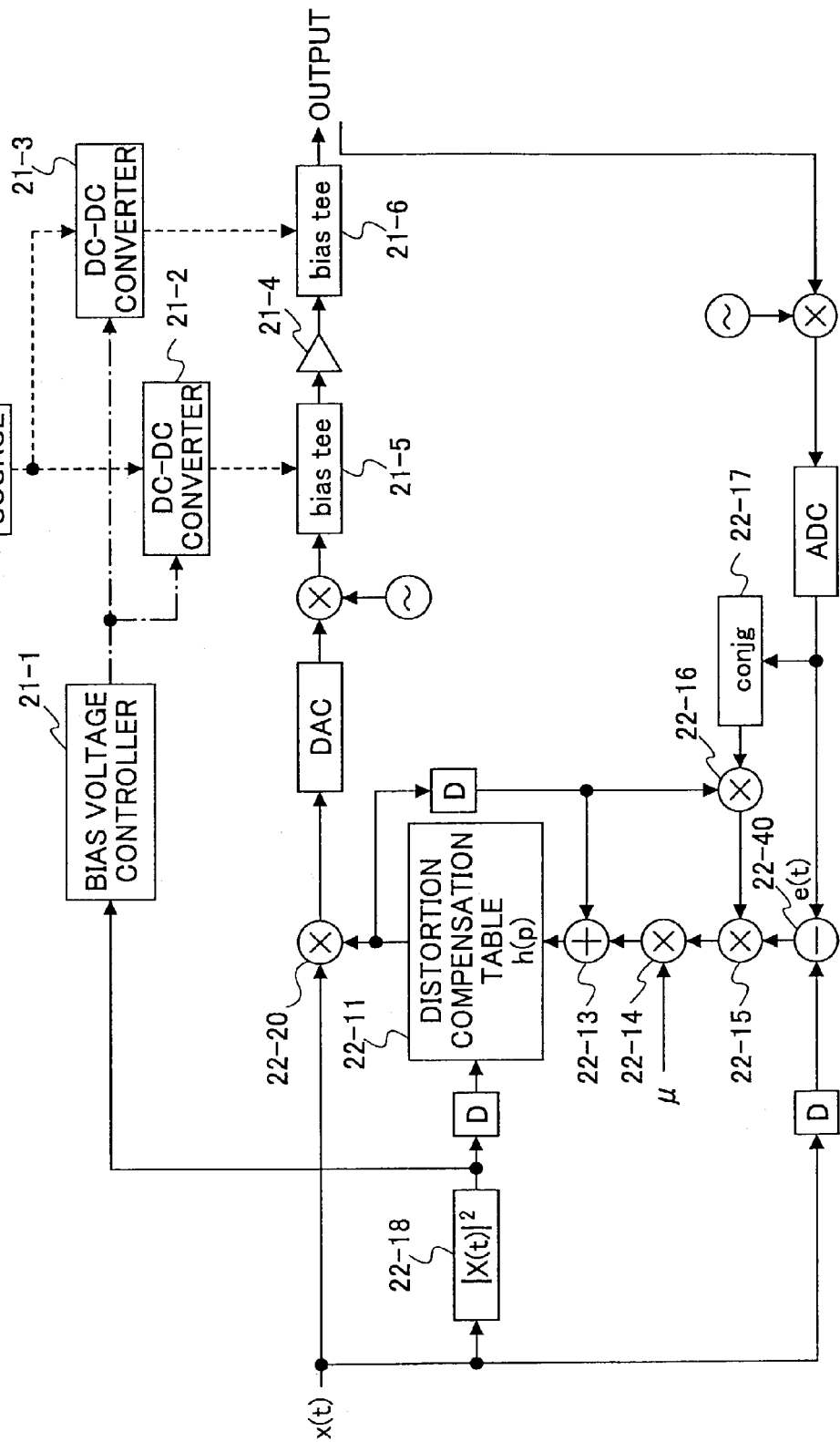
FIG. 9 shows the second embodiment of the present invention.

Next, the second embodiment of the present invention will be explained with reference to FIG. 9. Although the transmit power is calculated based on the transmit power control (TPC) signal in the first embodiment, the transmit power is calculated based on the amplitude of a baseband signal x (t) in this embodiment. Thus, the gain of the HPA is considered to be constant.

The electric power calculator 22-18 calculates the amplitude of a transmission signal x (t) and calculates the transmit power based on the calculated amplitude. The bias voltage, which maximizes the efficiency of the HPA with respect to this transmit power, is determined at the electric power calculator 22-18. The output voltage of the DC—DC converters 21-2, 21-3 is controlled according to the determined bias voltage.

In this embodiment, the arrangement in which the bias voltage is controlled according to the transmit power or the amplitude of the transmission output signal is also applicable. Furthermore, the arrangement in which the distortion compensation operation is carried out after the bias voltage control operation repeatedly is also applicable.

Figure 10:
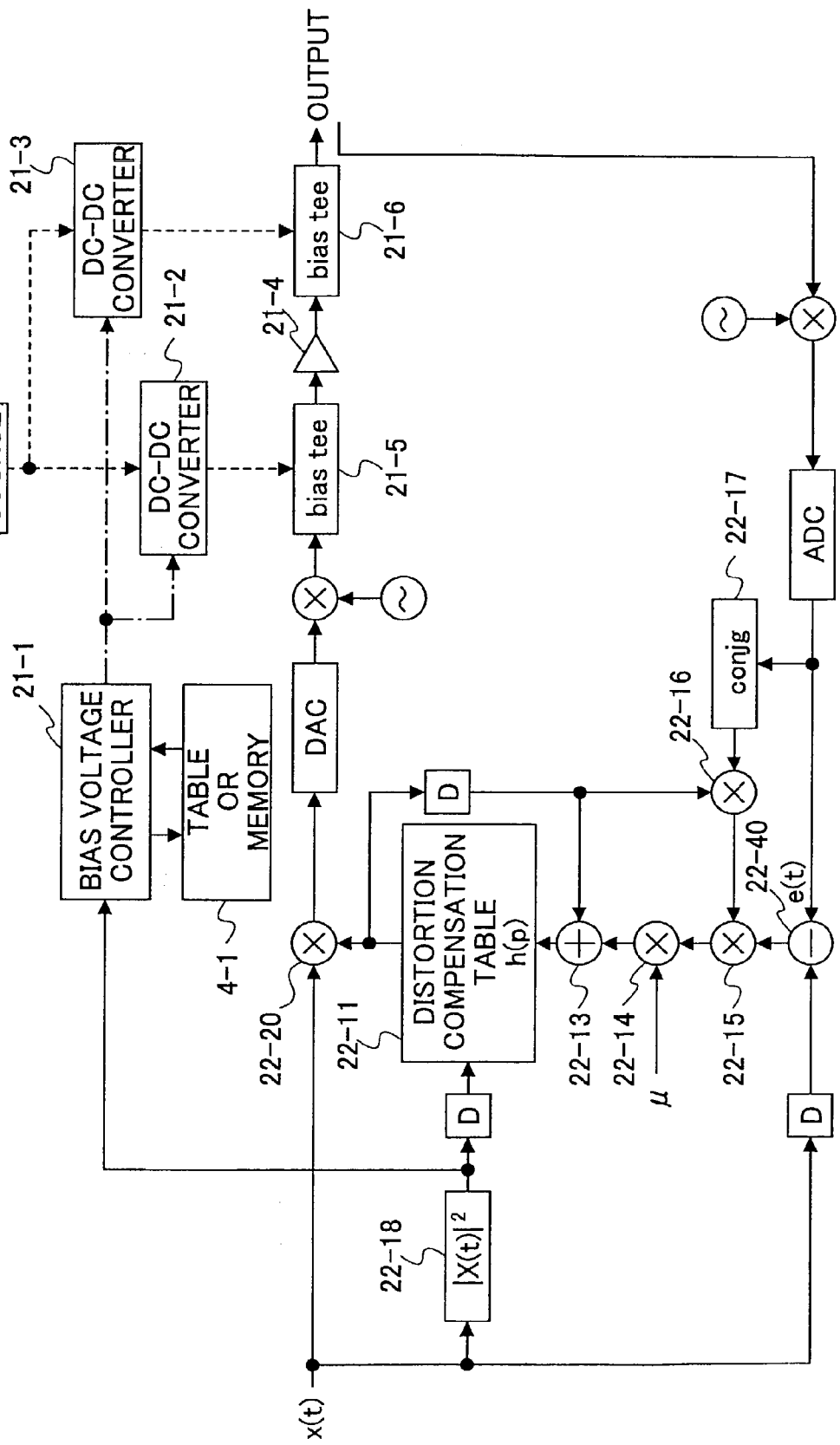
FIG. 10 shows the third embodiment of the present invention.

Next, the third embodiment of the present invention will be explained with reference to FIG. 10. In this embodiment, with a configuration the same as in the second embodiment, the table, which contains the values of the bias voltage to be determined according to the values of the transmit power, is stored in a memory device 4-1 in advance. In this embodiment, the bias voltage control is performed by reading out the value of bias voltage from the memory device 4-1 according to the determined transmit power.

Here, the values of the bias voltage contained in the table are set through the operation test at the final stage of production. Alternatively, the values of the bias voltage may be typical data based on the mean values of several HPAs. Furthermore, the values of the bias voltage may be rewritten after the expiration of a predetermined time interval to compensate for a secular variation.

Next, the fourth embodiment of the present invention will be explained with reference to FIG. 11. Although the aforementioned distortion compensation table 22-11 of the linearizer is defined in one dimension in the preceding embodiments, the distortion compensation table 5-1 is defined in two dimensions in this embodiment. In other words, bias voltage is added to the aforementioned distortion compensation table 22-11 as an additional parameter. Specifically, in this embodiment, the two-dimensional table 5-1 stores and retains the distortion compensation coefficients with respect to two parameters, that is to say, the transmit power and the bias voltage. For that reason, it becomes possible to use the distortion compensation coefficient according to the bias voltage of the HPA, whereby accelerating the convergence time taken for the distortion compensation as compared with the cases in the preceding embodiments.

Next, the fifth embodiment of the present invention will be explained with reference to FIG. 12. By the way, if a steep change in the bias voltage occurs during the bias voltage control according to the preceding embodiments, it causes the spectrum of the output signal of the HPA to spread, resulting in an increase of noise, that is to say, an increase of the distortion level.

Figure 11:
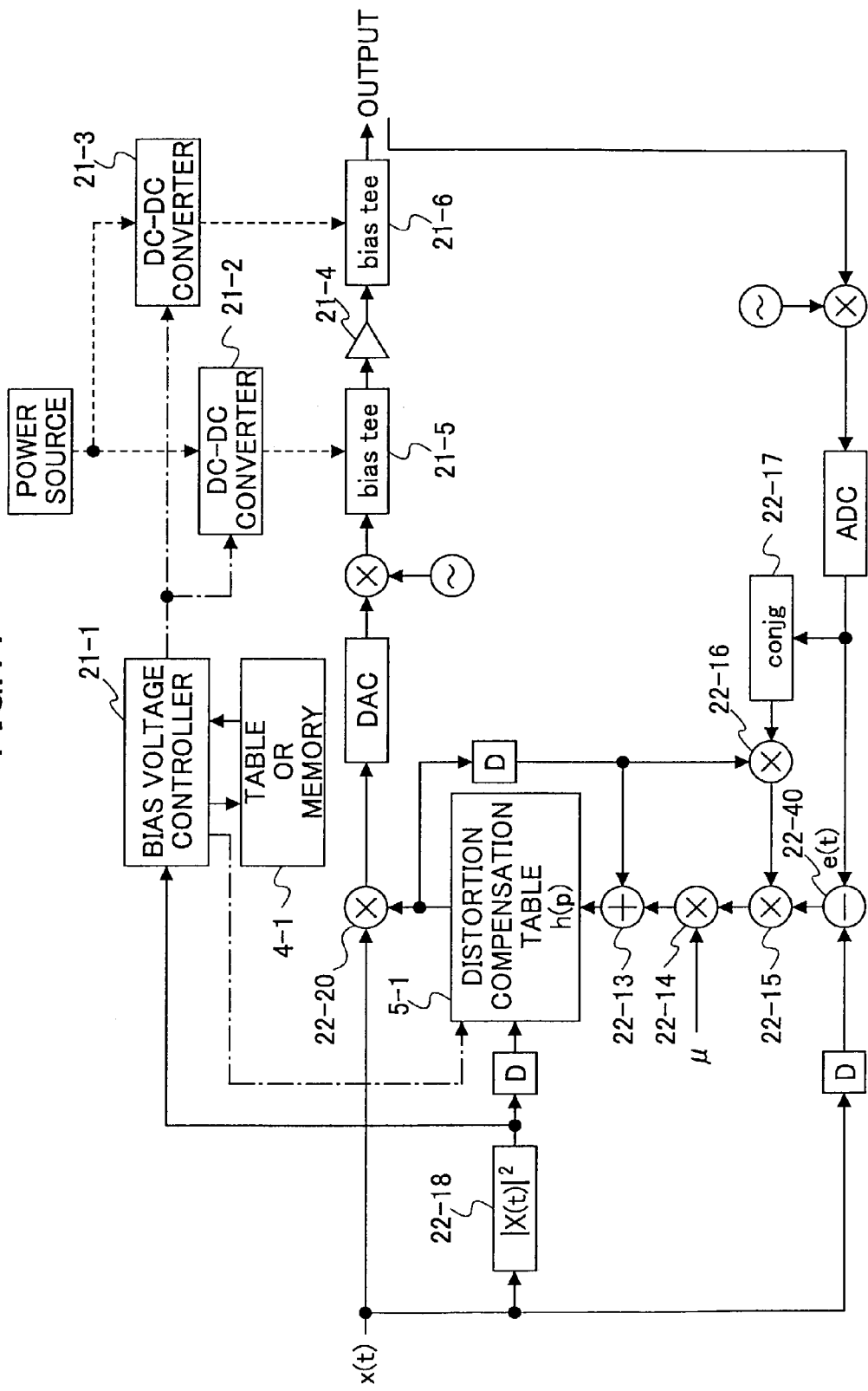
FIG. 11 shows the fourth embodiment of the present invention.
Figure 12A:
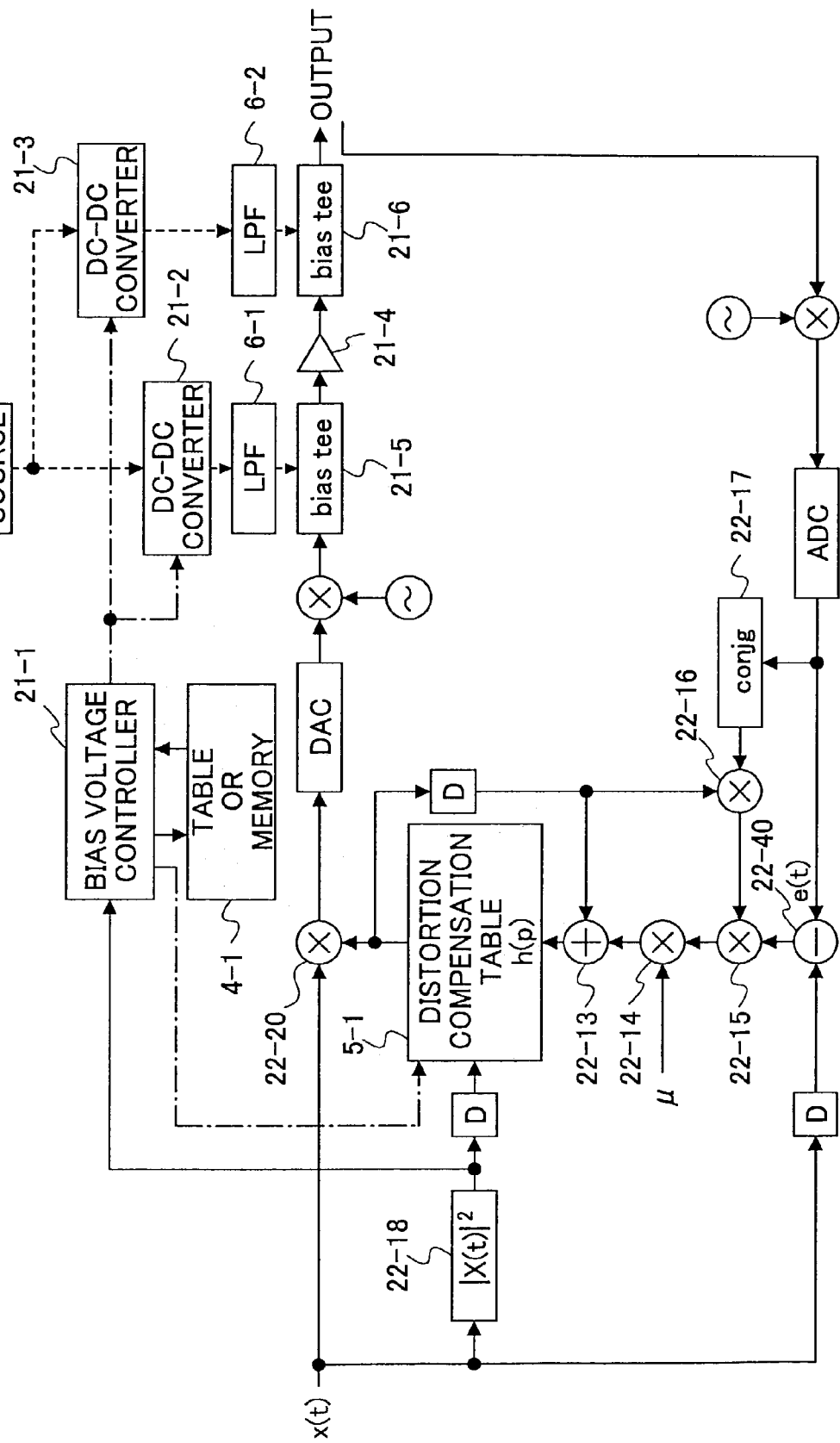
FIG. 12A shows the fifth embodiment of the present invention.
Figure 12B:
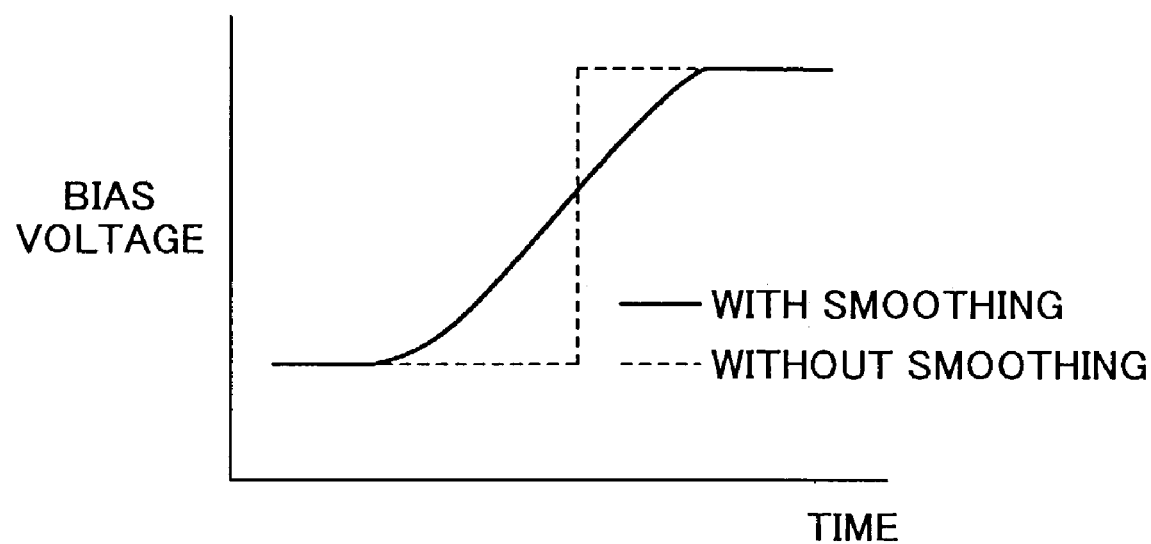
FIG. 12B shows a smoothed change of a bias voltage.

In order to suppress the steep change, with the same configuration as in the fourth embodiment shown in FIG. 11, the low-pass filters (LPF) 6-1, 6-2 are provided at the output side of the DC—DC converters 21-2, 21-3, respectively, to cut the high-frequency components, as shown in FIG. 12A. In this way, the change of the bias voltage is smoothed, as shown in FIG. 12B, whereby reducing the distortion level due to the steep change of the bias voltage. Consequently, it becomes possible to avoid the spectrum of the output signal of the HPA from spreading.

Next, the sixth embodiment of the present invention will be explained with reference to FIG. 13. By the way, in the preceding embodiments, the linearizer is operated using one or more transmission signals. At that time, a digital-to-analog converter (DAC) changes the combined signal of the transmission signal and the distortion compensation signal from digital to analog form. For this reason, a high resolution and a high conversion speed are demanded of the digital-to-analog converter.

Figure 13:
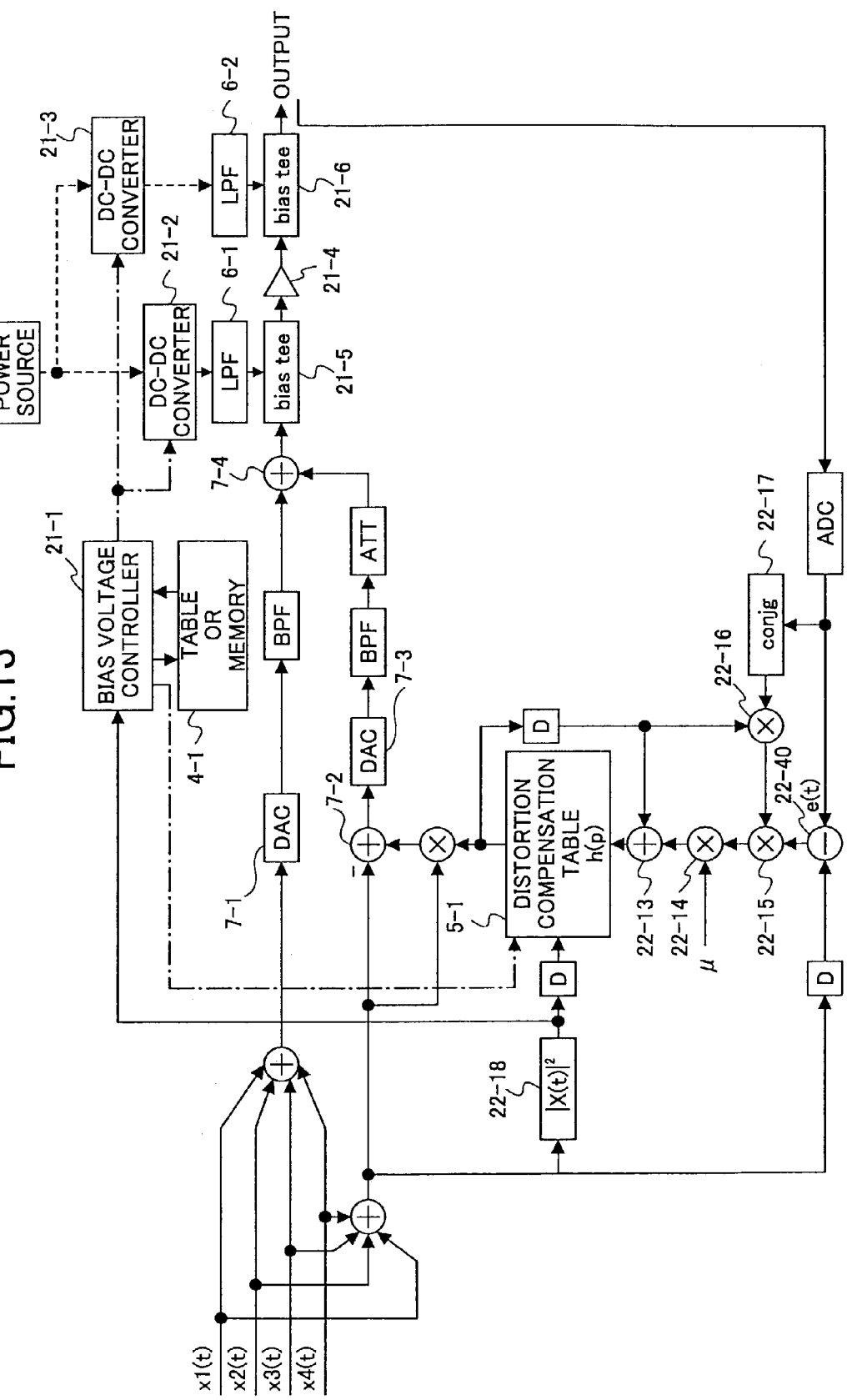
FIG. 13 shows the sixth embodiment of the present invention.

To this end, in this embodiment, the digital-to-analog conversions of the transmission signal and the distortion compensation signal are performed separately, as shown in FIG. 13. Specifically, the first digital-to-analog converter (DAC) 7-1 is assigned to convert only one transmission signal or several transmission signals.

Then, at a multiplier 22-20 the transmission signal is multiplied by the distortion compensation coefficient read out from the distortion compensation table 5-1, as is the case with the preceding embodiments, to obtain the distortion-compensated transmission signal. Then, at a subtracter 7-2 the transmission signal is subtracted from the distortion-compensated transmission signal to obtain the distortion compensation signal only. The second digital-to-analog converter (DAC) 7-3 converts only the distortion compensation signal into analog form. Then, at an adder 7-4 these two signals converted separately are added together to be input to the HPA. The remaining of operations are performed as in the case of the preceding embodiments. With this arrangement, it becomes possible to reduce a bit number to be processed by the digital-to-analog converter.

Figure 14:
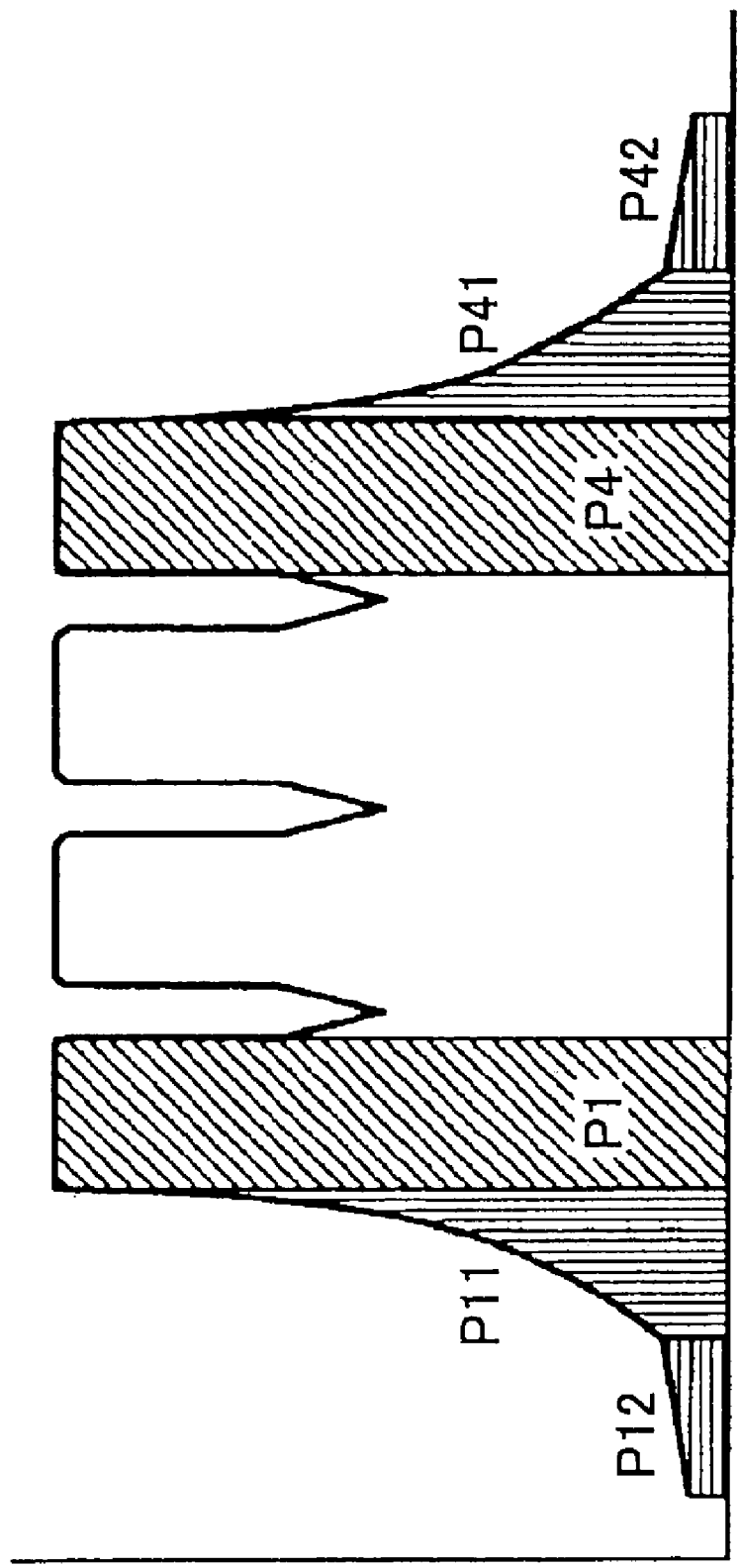
FIG. 14 shows an Adjacent Channel Leakage power Ratio (ACLR) in the case of four carrier waves.

Here, this embodiment relates to the transmission signals x1 (t), x2 (t), x3 (t), and x4 (t) of four carrier waves. Accordingly, the calculation of the Adjacent Channel Leakage power Ratio (ACLR) in the case of four carrier waves will be explained with reference to FIG. 14.

First of all, the transmit power P1 of the lowest carrier frequency (the area hatched diagonally in FIG. 14), the first Adjacent Channel Leakage power P11 (the area hatched horizontally in FIG. 14), and the second Adjacent Channel Leakage power P12 (the area hatched vertically in FIG. 14) are calculated. Then, the first Adjacent Channel Leakage power Ratio ACLR11 and the second Adjacent Channel Leakage power Ratio ACLR12 are calculated as follows.

$$ACLR11 = P11/P1 \quad (11)$$

$$ACLR12 = P12/P1 \quad (12)$$

Likewise, for the transmit power P4 of the highest carrier frequency, the first Adjacent Channel Leakage power Ratio ACLR41 and the second Adjacent Channel Leakage power Ratio ACLR42 are calculated as follows.

$$ACLR41 = P41/P4 \quad (13)$$

$$ACLR42 = P42/P4 \quad (14)$$

Next, the seventh embodiment of the present invention will be explained with reference to FIG. 15. In this embodiment, in addition to the distortion compensation operation in the non-linear area of the HPA as in the preceding embodiments, an operation for restraining the amplitude of the transmission signal is performed to avoid a divergence of the distortion compensation operations.

Figure 1:
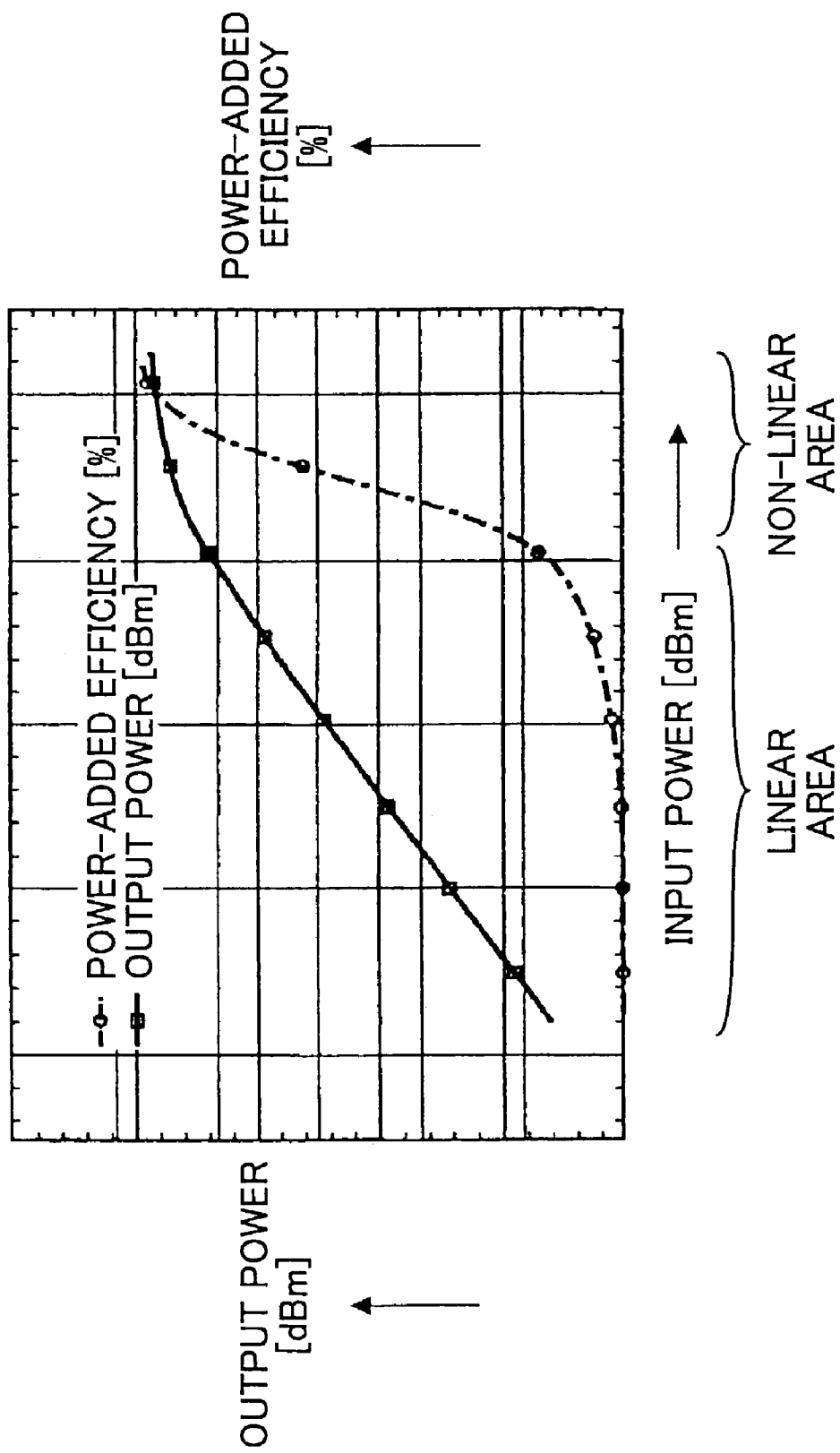
FIG. 1 shows the relationship between transmit power and power-added efficiency of a high power amplifier (HPA).

By the way, as for input-output characteristics of the HPA shown in FIG. 1, the output amplitude of the HPA versus the input amplitude is less in the non-linear area than in the linear area. However, the distortion compensation control in the non-linear area is performed in the manner the same as the distortion compensation control in linear area. In other words, because the amplitude of the output signal does not increase in spite of the fact that the control is performed so as to increase the amplitude, further control is performed so as to further increase the amplitude. As a consequence, the amplitude of the output signal of the HPA becomes too great to fall within the dynamic range. For this reason, a divergence of the distortion compensation control occurs, causing the distortion level to be increasingly more significant.

Figure 15A:
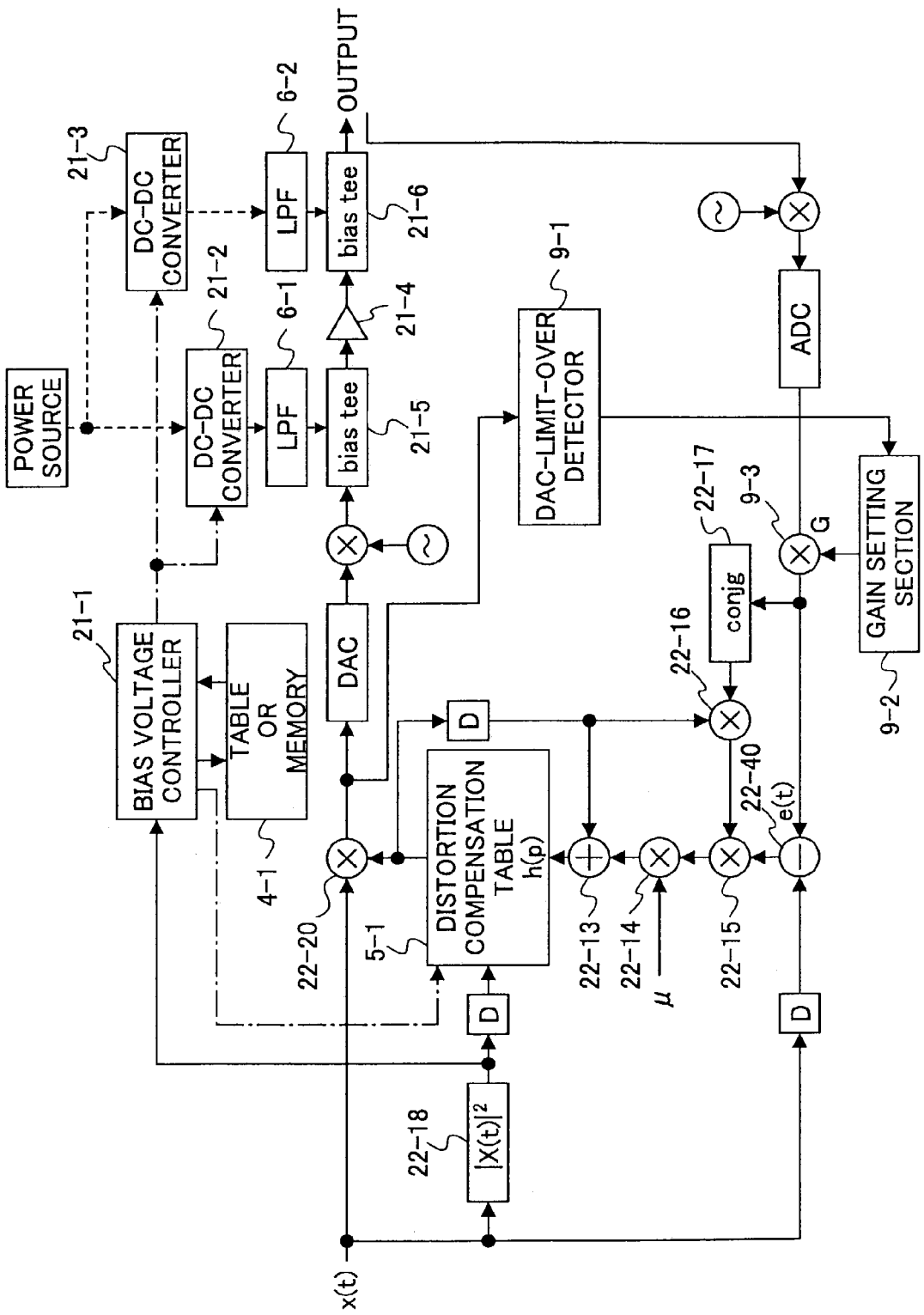
FIG. 15A shows the seventh embodiment of the present invention.

To this end, in this embodiment, a DAC-limit-over detector 9-1 is provided that detects when the transmission signal exceeds a threshold value or an upper limit value as to the dynamic range of the digital-to-analog converter (DAC), as shown in FIG. 15A. If the threshold value or an upper limit value is exceeded, the amplitude of a feedback signal of the transmission signal is amplified.

Figure 15B:
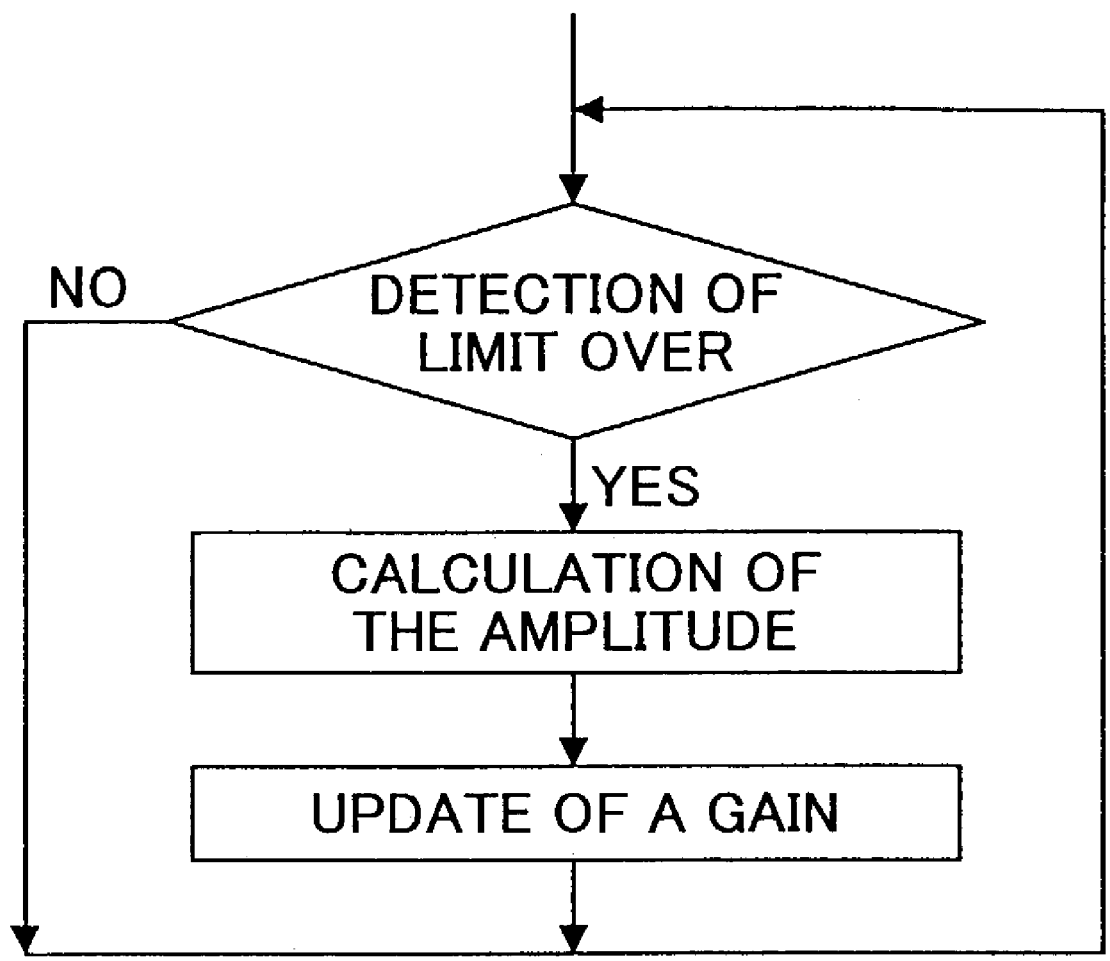
FIG. 15B shows an operation flow according to the seventh embodiment.

Specifically, if the DAC-limit-over detector 9-1 detects that the transmission signal exceeds a threshold value or an upper limit value, the DAC-limit-over detector 9-1 calculates the amplitude of that transmission signal and sends the calculated amplitude to a gain setting section 9-2. Then, the gain setting section 9-2 sets the gain according to the amplitude of that transmission signal and sends the gain to a multiplier 9-3. Then, the multiplier 9-3 multiplies the feedback signal of the transmission signal by the gain and outputs it to a subtracter 22-40. The flow of these operations is shown in FIG. 15B.

With this arrangement, because the amplitude of the feedback signal to be sent to subtracter 22-40 becomes apparently great, the divergence of the distortion compensation control is prevented. In other words, the distortion compensation control functions normally even at the point where the efficiency of the HPA versus the transmit power becomes the maximum. Accordingly, the bias voltage control and the distortion compensation control of the HPA enable dramatic improvement of the power-added efficiency.

Figure 16:
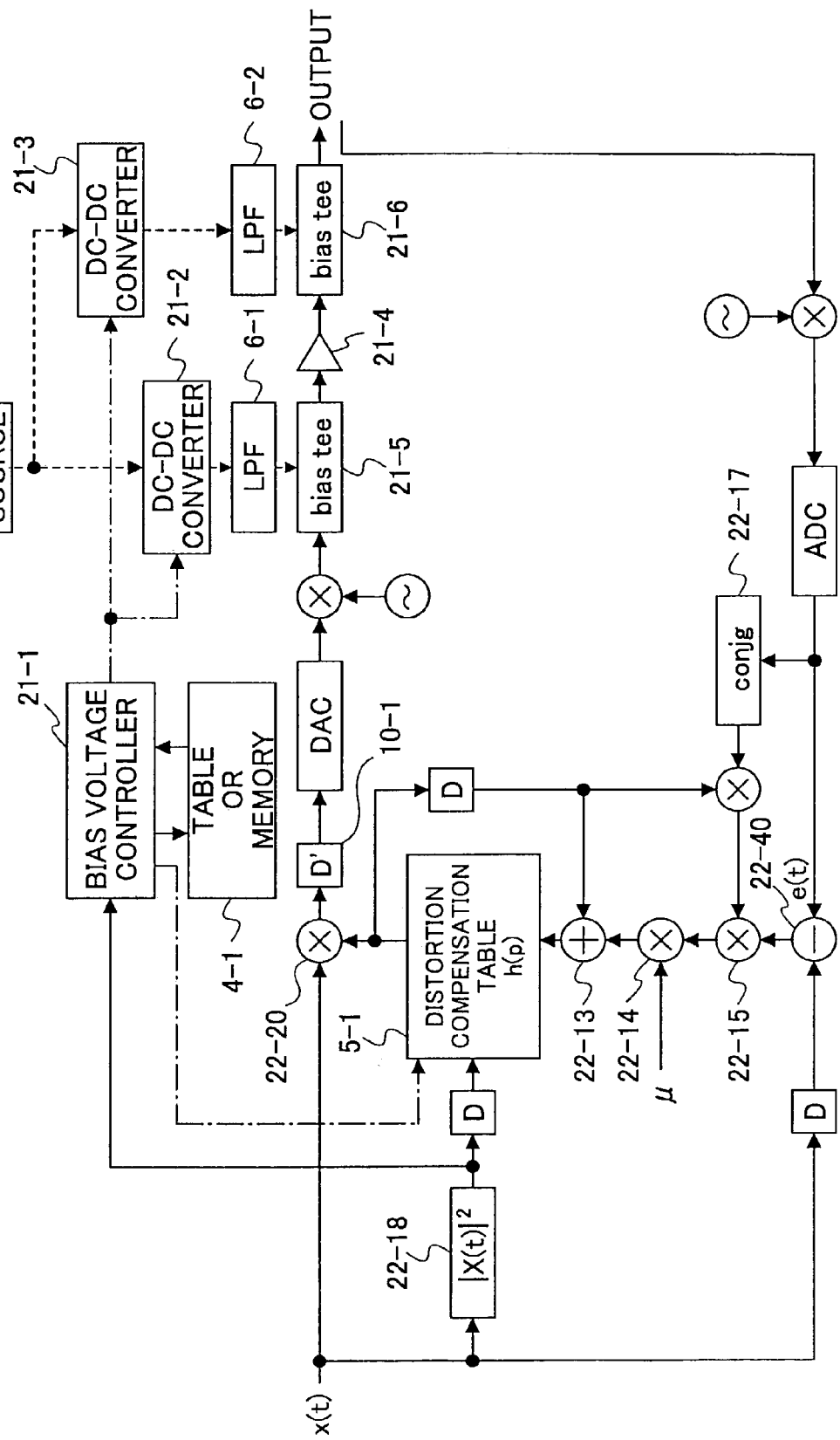
FIG. 16 shows the eighth embodiment of the present invention.

Next, the eighth embodiment of the present invention will be explained with reference to FIG. 16. By the way, according to the preceding embodiments, there may be delay in the bias voltage control due to the input/output impedance of the HPA and the frequency response of the bias tees 21-5, 21-6 that apply the bias voltage to the HPA.

To this end, in this embodiment, the transmission signal is input to the HPA with delay via a delay element (D') 10-1, such as a shift register, so that the transmission signal is input to the HPA after stability of the bias voltage control has been established. This arrangement enables an increase in the accuracy and stability of the bias voltage control of the HPA.

Figure 17:
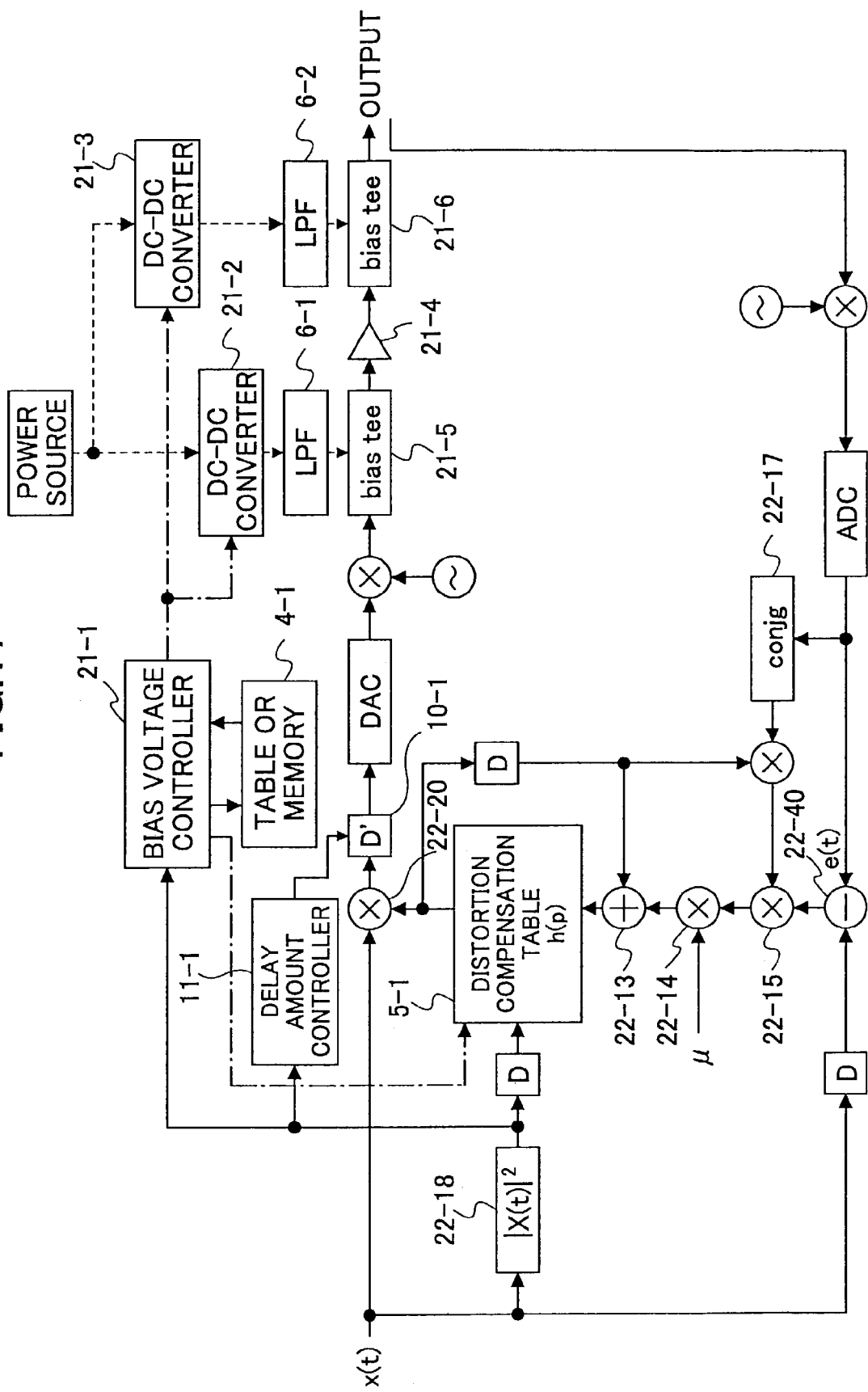
FIG. 17 shows the ninth embodiment of the present invention.

Next, the ninth embodiment of the present invention will be explained with reference to FIG. 17. In this embodiment, a delay amount controller 11-1 is provided which determines the delay amount of the delay element (D') 10-1 based on the transmit power calculated by the electric power calculator 22-18. The delay amount controller 11-1 controls the delay amount of the delay element (D') 10-1 based on the determined delay amount. This arrangement enables improvement of the accuracy and stability of the bias voltage control of the HPA.

Figure 18:
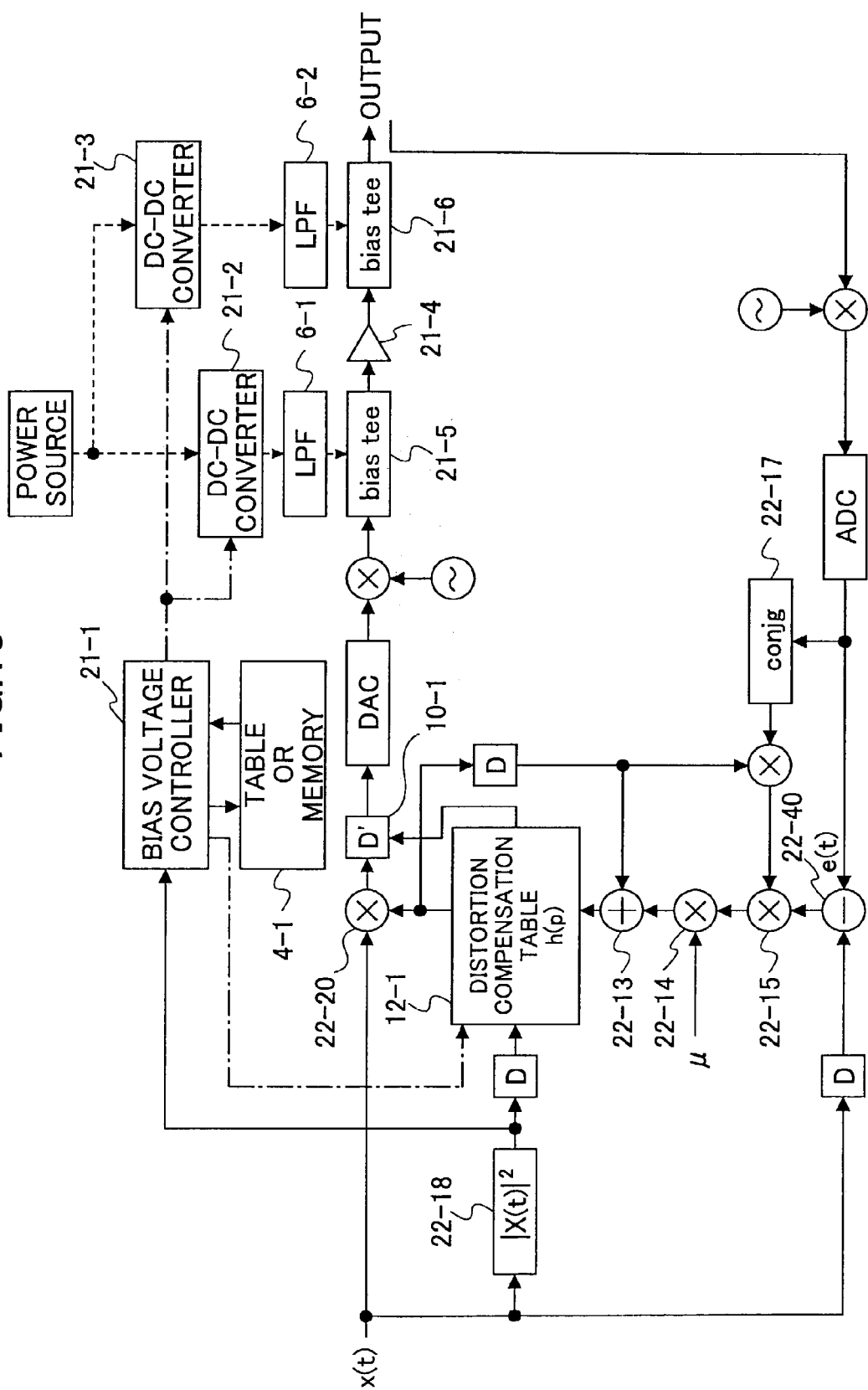
FIG. 18 shows the tenth embodiment of the present invention.

Next, the tenth embodiment of the present invention will be explained with reference to FIG. 18. In this embodiment, the delay amounts of the delay element (D') 10-1 associated with the power levels of the transmission signal are stored and retained in a distortion compensation table 12-1 that also stores and retains the distortion compensation coefficients associated with the power levels of the transmission signal. The delay amount of the delay element (D') 10-1 is read out from the distortion compensation table 12-1 according to the power level of the transmission signal.

Figure 19:
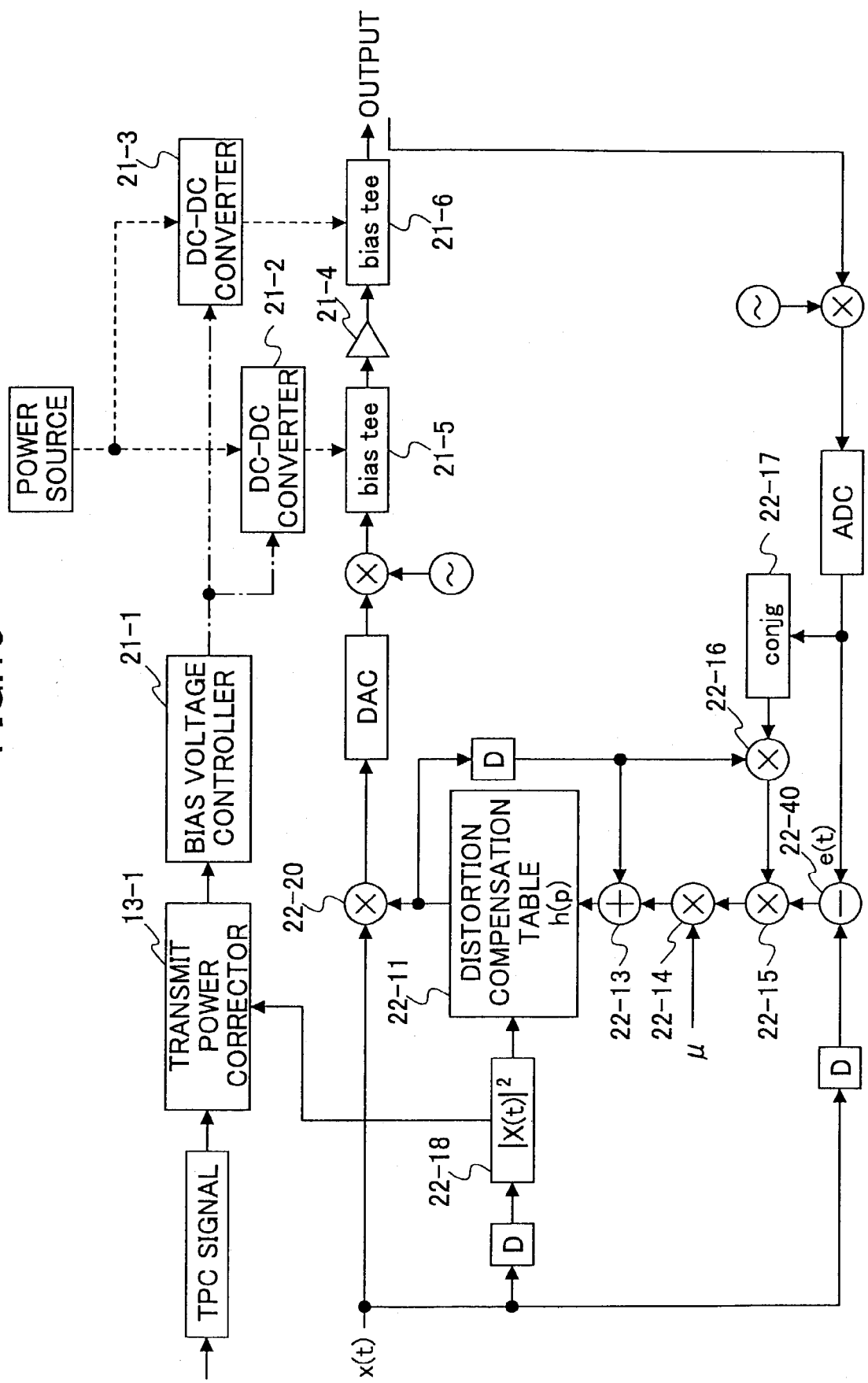
FIG. 19 shows the eleventh embodiment of the present invention.

Next, the eleventh embodiment of the present invention will be explained with reference to FIG. 19. In this embodiment, a transmit power corrector 13-1 is additionally provided which corrects the transmit power based on the difference between the transmit power control (TPC) signal and the output of the electric power calculator 22-18. The electric power calculator 22-18 outputs the transmit power calculated based on the amplitude of the transmission signal that has not yet undergone the distortion compensation.

Figure 20:
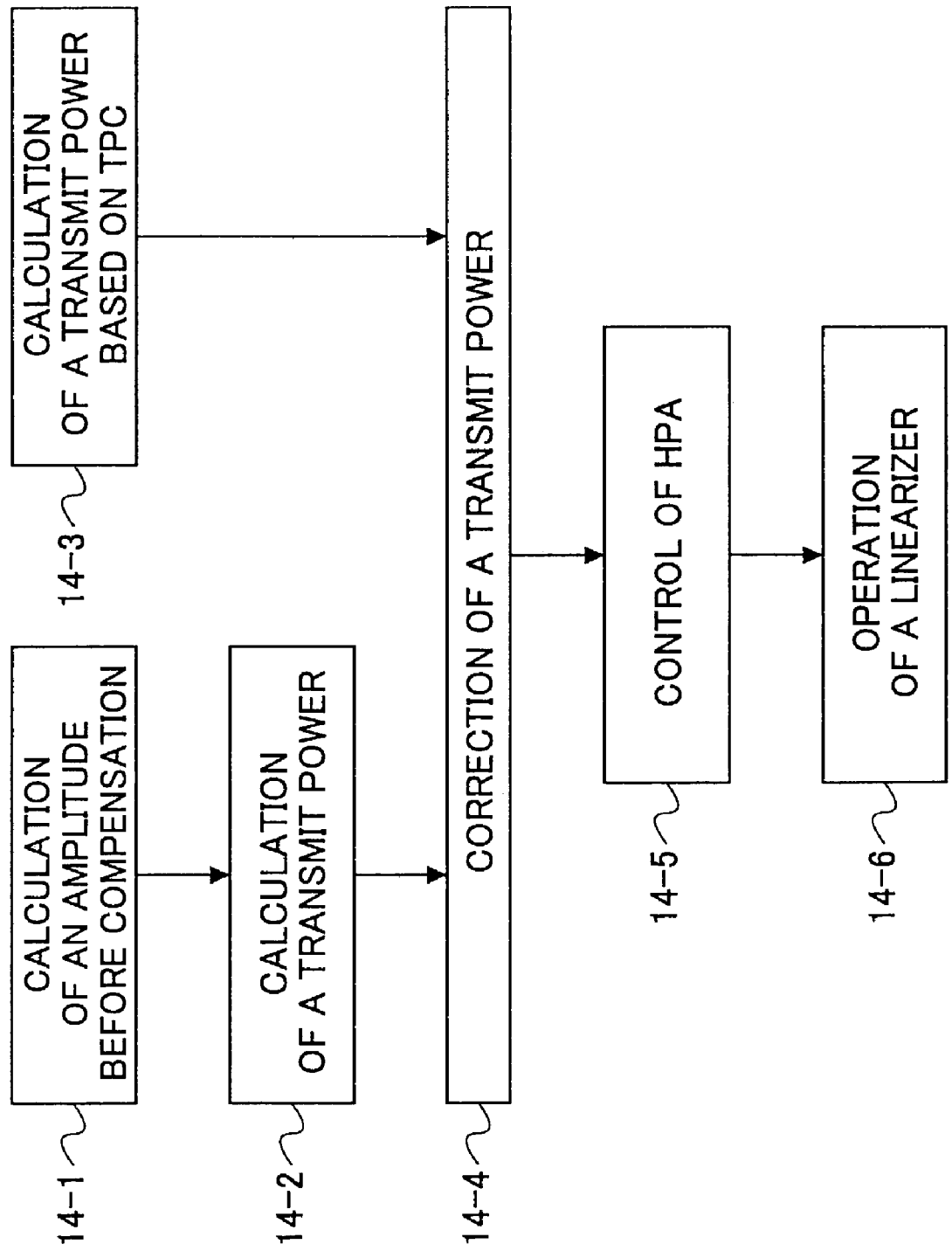
FIG. 20 shows the operation flow according to the eleventh embodiment.

FIG. 20 shows the flow of the operations according to this embodiment. The amplitude of the transmission signal that has not yet undergone the distortion compensation is calculated (Step: 14-1) and the transmit power $P_{X(t)}$ is calculated (Step: 14-2) by the electric power calculator 22-18. On the other hand, the transmit power $P_{TPC}$ is calculated using the transmit power control (TPC) signal (Step: 14-3).

The transmit power corrector 13-1 calculates the difference between the transmit power $P_{X(t)}$ and the transmit power $P_{TPC}$ and corrects the transmit power according to the calculated difference (Step: 14-4). The power supply voltage of the HPA is calculated and controlled according to the corrected transmit power (Step: 14-5) and the distortion compensator (linearizer) is operated accordingly (Step: 14-6).

At that time, if $P_{TPC}-P_{X(t)} \geq 0$, the control of the power supply voltage of the HPA is performed so that the power-added efficiency with respect to $P_{X(t)}$ becomes the maximum. Likewise, if $P_{TPC}-P_{X(t)}<0$, the control of the power supply voltage of the HPA is performed so that the power-added efficiency with respect to $P_{TPC}$ becomes the maximum. This arrangement enables improvement of the accuracy of the transmit power.

Figure 21:
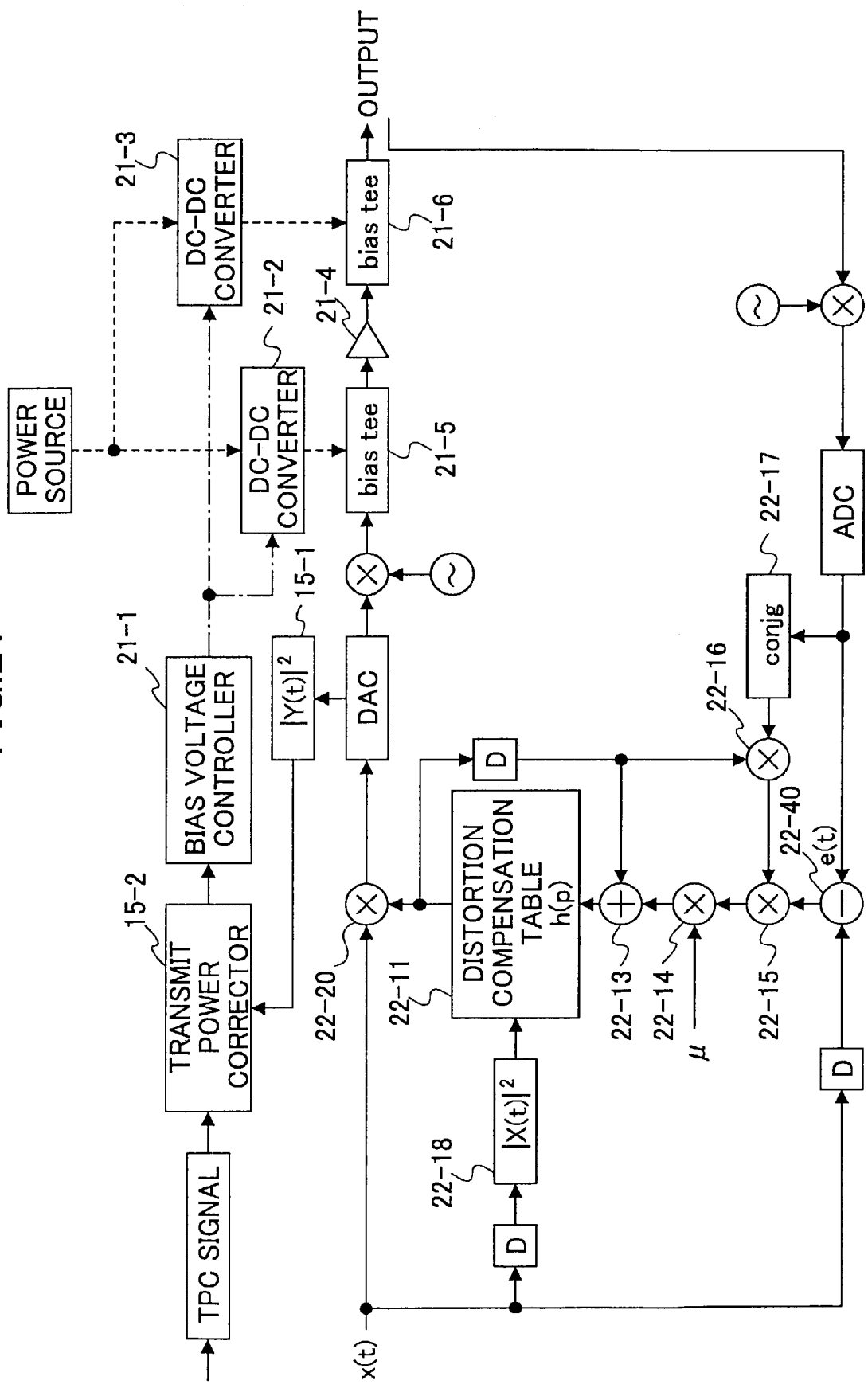
FIG. 21 shows the twelfth embodiment of the present invention.

Next, the twelfth embodiment of the present invention will be explained with reference to FIG. 21. In this embodiment, a transmit power corrector 15-2 is additionally provided which corrects the transmit power based on the difference between the transmit power control (TPC) signal and the output of the electric power calculator 15-1. The electric power calculator 22-18 outputs the transmit power calculated based on the amplitude of the transmission signal that has undergone the distortion compensation.

FIG. 22 shows the flow of the operations according to this embodiment. The amplitude of the transmission signal that has not yet undergone the distortion compensation is calculated (Step: 16-1) and the transmit power $P_{X(t)}$ is calculated (Step: 16-2) by the electric power calculator 15-1. On the other hand, the transmit power $P_{TPC}$ is calculated using the transmit power control (TPC) signal (Step: 16-3).

The transmit power corrector 15-2 calculates the difference between the transmit power $P_{X(t)}$ and the transmit power $P_{TPC}$ and corrects the transmit power according to the calculated difference (Step: 16-4). The power supply voltage of the HPA is calculated and controlled according to the corrected transmit power (Step: 16-5) and the distortion compensator (linearizer) is operated accordingly (Step: 16-6).

As is the case with the above-mentioned eleventh embodiment, if $P_{TPC}-P_{X(t)} \geq 0$, the control of the power supply voltage of the HPA is performed so that the power-added efficiency with respect to $P_{X(t)}$ becomes the maximum. Likewise, if $P_{TPC}-P_{X(t)}<0$, the control of the power supply voltage of the HPA is performed so that the power-added efficiency with respect to $P_{TPC}$ becomes the maximum. This arrangement enables the accuracy of a correction of the transmit power to be further improved because of using the distortion compensated transmission signal.

Further, the present invention is not limited to the above-described embodiments, and variations and modifications may be made without departing from the scope of the present invention.

The present application is based on and claims the benefit of the earlier filing date of Japanese Patent application No. 2002-142509, filed on May 17, 2002.

What is claimed is:

1. A radio comprising:
a power amplifier for amplifying a signal to be transmitted;
a distortion compensator for compensating a distortion of the power amplifier, said distortion compensator having
a distortion compensation coefficient update part for updating distortion compensation coefficients based on a difference between a transmission input signal input to the power amplifier and a feedback signal of a transmission output signal output from the power amplifier,
a memory part for storing said distortion compensation coefficients, and
a distortion compensation coefficient multiplier for reading out the distortion compensation coefficient from said memory part according to a level of a transmission input signal and multiplying said transmission input signal by said distortion compensation coefficient; and
a bias voltage controller for determining a bias voltage of the power amplifier based on the level of the transmission input signal or a transmit power control signal so as to substantially maximize power efficiency of the power amplifier over a whole operational area thereof while meeting a specification as to an Adjacent Channel Leakage power Ratio (ACLR).

2. The radio according to claim 1, wherein,
the bias voltage controller reads out the bias voltage that substantially maximizes power efficiency of the power amplifier from a memory device.

3. The radio according to claim 1, wherein,
the memory part stores the distortion compensation coefficients, each of the distortion compensation coefficients being associated with a level of the transmission input signal and a level of the bias voltage, and
the distortion compensation coefficient multiplier reads out the distortion compensation coefficient from the memory part according to a level of the transmission input signal and multiplies a transmission input signal by said read out distortion compensation.

4. The radio according to claim 1, wherein,
the bias voltage controller smoothes a change of the bias voltage of the power amplifier.

5. The radio according to claim 4, wherein,
the bias voltage controller applies the bias voltage to the power amplifier via a low-pass filter.

6. A radio comprising:
a power amplifier for amplifying a signal to be transmitted;
a distortion compensator for compensating a distortion of the power amplifier, said distortion compensator having
a distortion compensation coefficient update part for updating distortion compensation coefficients based on a difference between a transmission input signal input to the power amplifier and a feedback signal of a transmission output signal output from the power amplifier,
a memory part for storing said distortion compensation coefficients, and
a distortion compensation coefficient multiplier for reading out the distortion compensation coefficient from said memory part according to a level of a transmission input signal and multiplying said transmission input signal by said distortion compensation coefficient;

a bias voltage controller for determining a bias voltage of the power amplifier based on the level of the transmission input signal or a transmit power control signal so as to improve power efficiency of the power amplifier;

a signal divider for dividing a distortion compensated transmission input signal into a transmission input signal and a distortion compensation signal by subtracting the transmission input signal from the distortion compensated transmission input signal;

digital-to-analog converters for digital-to-analog converting the transmission input signal and distortion compensation signal separately; and a signal combiner for combining the transmission input signal and the distortion compensation signal to generate the transmission input signal to be input to the power amplifier.

7. The radio according to claim 6, further comprising:

a limit-over detector configured to determine whether the level of the transmission input signal just before being input to the power amplifier exceeds a predetermined threshold value or not;

a gain setting section for setting a gain that increases the level of the feedback signal if the predetermined threshold value is exceeded.

8. The radio according to claim 6, further comprising:

a calculator for calculating a transmit power based on an amplitude of a distortion uncompensated transmission input signal; and a transmit power corrector for correcting transmit power based on a difference between the transmit power control signal and an output signal of the calculator.

9. The radio according to claim 6, further comprising:

a calculator for calculating a transmit power based on an amplitude of a distortion compensated transmission input signal; and a transmit power corrector for correcting transmit power based on a difference between the transmit power control signal and an output signal of the calculator.

10. A radio comprising:

a power amplifier for amplifying a signal to be transmitted;

a distortion compensator for compensating a distortion of the power amplifier, said distortion compensator having a distortion compensation coefficient update part for updating distortion compensation coefficients based on a difference between a transmission input signal input to the power amplifier and a feedback signal of a transmission output signal output from the power amplifier, a memory part for storing said distortion compensation coefficients, and a distortion compensation coefficient multiplier for reading out the distortion compensation coefficient from said memory part according to a level of a transmission input signal and multiplying said transmission input signal by said distortion compensation coefficient; and a bias voltage controller for determining a bias voltage of the power amplifier based on the level of the transmission input signal or a transmit power control signal so as to improve power efficiency of the power amplifier, wherein, the distortion compensated transmission input signal is input to the power amplifier via a delay element so that the input of the distortion compensated transmission input signal is timed to the setting of the bias voltage.

11. The radio according to claim 10, wherein, a delay amount at the delay element is determined according to a level of a transmission input signal.

12. The radio according to claim 11, wherein, the delay amount is read out from the memory part storing delay amount data associated with a level of a transmission input signal.

13. The radio according to claim 10, further comprising:

a calculator for calculating a transmit power based on an amplitude of a distortion uncompensated transmission input signal; and a transmit power corrector for correcting transmit power based on a difference between the transmit power control signal and an output signal of the calculator.

14. The radio according to claim 10, further comprising:

a calculator for calculating a transmit power based on an amplitude of a distortion compensated transmission input signal; and a transmit power corrector for correcting transmit power based on a difference between the transmit power control signal and an output signal of the calculator.

* * * * *